US012436455B2

(12) United States Patent
Tsunoda et al.

(10) Patent No.: US 12,436,455 B2
(45) Date of Patent: Oct. 7, 2025

(54) MASK INFORMATION ADJUSTING APPARATUS, MASK DATA ADJUSTING METHOD, AND PROGRAM

(71) Applicant: NIPPON CONTROL SYSTEM CORPORATION, Tokyo (JP)

(72) Inventors: Dai Tsunoda, Kanagawa (JP); Yasuaki Horima, Kanagawa (JP)

(73) Assignee: NIPPON CONTROL SYSTEM CORPORATION, Tokyo (JP)

( * ) Notice: Subject to any disclaimer, the term of this patent is extended or adjusted under 35 U.S.C. 154(b) by 626 days.

(21) Appl. No.: 17/913,726

(22) PCT Filed: Mar. 26, 2021

(86) PCT No.: PCT/JP2021/012925
§ 371 (c)(1),
(2) Date: Sep. 22, 2022

(87) PCT Pub. No.: WO2021/205906
PCT Pub. Date: Oct. 14, 2021

(65) Prior Publication Data
US 2023/0106324 A1    Apr. 6, 2023

(30) Foreign Application Priority Data

Apr. 8, 2020    (JP) ................................ 2020-069815

(51) Int. Cl.
*G03F 1/70* (2012.01)
(52) U.S. Cl.
CPC ..................................... *G03F 1/70* (2013.01)
(58) Field of Classification Search
CPC ..... G03F 1/70; G03F 1/76; G03F 7/20; G03F 7/70508; G03F 1/36; G06F 30/398; G06F 2119/00; G06F 30/392; H01L 21/027
(Continued)

(56) References Cited

U.S. PATENT DOCUMENTS 6,343,370 B1    1/2002  Taoka et al.
6,539,111 B2    3/2003  Kuwata
(Continued)

FOREIGN PATENT DOCUMENTS

CN    106094422 A    11/2016
CN    110832400 A    2/2020
(Continued)

OTHER PUBLICATIONS

"Byung-Gook Kim, Sung Soo Suh, Byung-Sung Kim, Sang-Gyun Woo, Han-Ku Cho, Vikram Tolani, Grace Dai, Dave Irby, Kechang Wang, Guangming Xiao, David Kim, Ki-Ho Baik, and Bob Gleason ""Trade-off between inverse.Lithography mask complexity and lithographic performance"", Proc. SPIE 7379, Photomask and Next-Generation Lithography Mask Technology XVI, 73791M (Jun. 9, 2009); https://doi.org/10.1117/12.824299https://www.spiedigitallibrary.org/conference-proceedings-of-spie/7379/1/Trade-off-between-inverse-lithography-mask-complexity".
(Continued)

*Primary Examiner* — Paul Dinh
(74) *Attorney, Agent, or Firm* — Rimon P.C.

(57) ABSTRACT

In order to solve a problem of conventional mask information adjusting apparatuses in which the data size of mask information that can produce precise exposure patterns is large, an mask information adjusting apparatus includes: a subject information acquiring unit that acquires pre-adjustment mask information containing a polygonal mask pattern; a processing unit that acquires the degree of influence of removal of each vertex or side of the mask pattern, on an exposure pattern that is generated using a photomask corresponding to the mask pattern, in association with the vertex or point, and simplifies the mask pattern by removing each vertex or side according to whether or not a predetermined condition regarding the acquired degree of influence
(Continued)

is satisfied; and an output unit that outputs post-adjustment mask information containing the mask pattern that has been simplified by the processing unit.

16 Claims, 20 Drawing Sheets

(58) Field of Classification Search
USPC .......................................................... 716/54
See application file for complete search history.

(56) References Cited

U.S. PATENT DOCUMENTS

| | | | |
|---|---|---|---|
| 10,534,257 | B2 | 1/2020 | Tetiker et al. |
| 2003/0093767 | A1 | 5/2003 | Murai et al. |
| 2005/0251771 | A1 | 11/2005 | Robles |
| 2012/0096413 | A1* | 4/2012 | Arai .......................... G03F 1/70 716/53 |
| 2013/0070222 | A1 | 3/2013 | Fujimura |
| 2015/0178431 | A1 | 6/2015 | Arai |
| 2017/0277035 | A1 | 9/2017 | Tsunoe |

FOREIGN PATENT DOCUMENTS

| | | |
|---|---|---|
| JP | 06-214376 A | 8/1994 |
| JP | 2000-182921 A | 6/2000 |
| JP | 2000-187314 A | 7/2000 |
| JP | 2006-165146 A | 6/2006 |
| JP | 2008-065246 A | 3/2008 |
| JP | 2009-163110 A | 7/2009 |
| JP | 2010-161268 A | 7/2010 |
| JP | 2012-129479 A | 7/2012 |
| JP | 2014-530494 | 11/2014 |
| JP | 2015-109099 A | 6/2015 |
| JP | 2015-125162 A | 7/2015 |
| JP | 2016-082150 A | 5/2016 |
| WO | 2016/063580 A1 | 4/2016 |

OTHER PUBLICATIONS

Japanese Office Action dated Sep. 26, 2023 issued in the corresponding Japanese Patent Application No. 2020-069815, with English machine translation.

Notice of Reasons for Refusal received in corresponding Japanese Patent Application No. 2020-069815, issued Feb. 6, 2024.

Request for the Submission of an Opinion dated May 29, 2025 issued in the corresponding Korean Patent Application No. 10-2022-7034386, with English machine translation.

International Search Report issued in corresponding International Application No. PCT/JP2021/012925, dated Jun. 1, 2021, w/ English Translation (7 pages).

Urs Ramar "An iterative procedure for the polygonal approximation of plane curves" Computer Graphics and Image Processing, vol. 1, Issue 3, Nov. 1972, pp. 244-256 doi://10.1016/S0146-664X(72)80017-0.

Monica Laurel Kempsell, Eric Hendrickx, Alexander V. Tritchkov, Kyohei Sakajiri, Kenichi Yasui, Susuki Yoshitake, Yuri Granik, Geert Vandenberghe, and Bruce W. Smith "Inverse lithography for 45-nm-node contact holes at 1.35 numerical aperture," Journal of Micro/Nanolithography, MEMS, and MOEMS 8(4), 043001 (Oct. 1, 2009). doi://10.1117/1.3263702.

Office Action issued in corresponding Taiwan Application No. 110112197, dated Mar. 21, 2022, with English Translation.

"Dai Tsunoda, Yohei Torigoe, Yutaro Sato, Masakazu Hamaji, Gek-Soon Chua, and Christian Bürgel ""Applying MPC for EUV mask fabrication"", Proc. SPIE 10810, Photomask Technology 2018, 108101H (Oct. 3, 2018); https://doi.org/10.1117/12.2502068https://www.spiedigitallibrary.org/conference-proceedings-of-spie/10810/108101H/Applying-MPC-for-EUV-mask-fabrication/10.1117/12.2502068.short".

"Bahaa E.A. Saleh and Soheil I. Sayegh ""Reduction Of Errors Of Microphotographic Reproductions By Optimal Corrections Of Original Masks,"" Optical Engineering 20(5), 205781 (Oct. 1, 1981). https://doi.org/10.1117/12.7972810https://www.spiedigitallibrary.org/journals/optical-engineering/volume-20/issue-5/205781/Reduction-Of-Errors-Of-Microphotographic-Reproductions-By-Optimal-Corrections-Of/10.1117/12.7972810.short".

Chris Spence, Quan Zhang, Vincent Shu, Been-Der Chen, Stanislas Baron, Yasuko Saito, Masakazu Hamaji, Yasuaki Horima, and Shuichiro Ohara ""Manufacturing challenges for curvilinear masks""", Proc. SPIE 10451, Photomask Technology 2017, 1045104 (Oct. 16, 2017).

Byung-Gook Kim, Sung Soo Suh, Byung-Sung Kim, Sang-Gyun Woo, Han-Ku Cho, Vikram Tolani, Grace Dai, Dave Irby, Kechang Wang, Guangming Xiao, David Kim, Ki-Ho Baik, and Bob Gleason ""Trade-off between inverse lithography mask complexity and lithographic performance""", Proc. SPIE 7379, Photomask and Next-Generation Lithography Mask Technology XVI, 73791M (Jun. 9, 2009).

\* cited by examiner

MASK INFORMATION ADJUSTING APPARATUS, MASK DATA ADJUSTING METHOD, AND PROGRAM

CROSS REFERENCE TO RELATED APPLICATIONS

This application is the U.S. National Phase under 35 U.S.C. § 371 of International Application No. PCT/JP2021/012925, filed on Mar. 26, 2021, which in turn claims the benefit of Japanese Application No. 2020-069815, filed on Apr. 8, 2020, the entire contents of each are hereby incorporated by reference.

TECHNICAL FIELD

The present invention relates to a mask information adjusting apparatus, a mask data adjusting method, and a program for outputting mask information for use in the production of photomasks.

BACKGROUND ART

Photomasks are used in the exposure step of the semiconductor production process. Photomasks are formed as follows. That is to say, resist is applied to a mask substrate called a blank. The resist is then patterned with an electron beam. Subsequently, the development, etching, and stripping processes are performed to form a photomask.

Incidentally, the recent development of finer process rules is accompanied by a problem in which, in the exposure step, portions with patterns smaller (finer) than the wavelength of light and the like are not resolved as per the mask pattern. In order to ultimately obtain an ideal exposure pattern in the exposure step, it is necessary to take countermeasures to deal with this problem. Countermeasures include, for example, applying an OPC (optical proximity effect correction) technology or using ILT (inverse lithograph technology) to generate mask patterns for photomasks (see Patent Document 1 below, for example).

In ILT, the entire process including the exposure system is taken as a model equation, the mask pattern is taken as a variable, and the equation is solved so that the wafer pattern obtained from the model equation matches the design pattern, thereby deriving an ideal mask pattern. For example, the mask pattern obtained using ILT is a set of smooth curves.

Incidentally, as mask patterns are optimized in response to finer process rules, the mask patterns become more complex. In addition, when ILT and the like described above are used, the resulting mask patterns will contain smooth closed curves. In a system for producing photomasks, it may not be possible to handle mask patterns containing such curves as they are. In such cases, it is necessary to approximate the smooth closed curves to polygons and make them available to the system. In order to obtain precise exposure patterns, the precision of the approximation has to be improved. Polygonal mask patterns with complex shapes and mask patterns with enhanced approximation precision have a large number of vertices. Accordingly, as the number of vertices in a mask pattern increases, the data size of mask information becomes larger.

The large data size of mask information has various adverse effects on the production flow. Transferring mask information between bases or devices that handle mask information takes time proportional to the data size. In addition, the processing time for mask data preparation such as fracturing and MPC (mask process correction) depends on the data size. Writing apparatuses for writing photomasks and the photomask inspection apparatuses execute the process while referring to the mask information. Accordingly, if mask information with too large data size is used, the throughput of the system for producing photomasks may deteriorate.

In order to reduce the data size of the mask information, for example, it is conceivable to simplify polygons using the Ramar-Dougrass-Peuker algorithm or the like as described in Non-Patent Document 1 below. Furthermore, for example, Non-Patent Document 2 below describes that the amount of data can be reduced by optimizing the grid size when performing OPC.

CITATION LIST

Patent Document

Patent Document 1: JP 2014-530494A (Tokuhyo)

Non-Patent Document

Non-Patent Document 1: Urs Ramar "An iterative procedure for the polygonal approximation of plane curves" Computer Graphics and Image Processing, Volume 1, Issue 3, November 1972, Pages 244-256 doi://10.1016/S0146-664X(72)80017-0

Non-Patent Document 2: Monica Laurel Kempsell, Eric Hendrickx, Alexander V. Tritchkov, Kyohei Sakajiri, Ken-ichi Yasui, Susuki Yoshitake, Yuri Granik, Geert Vandenberghe, and Bruce W. Smith "Inverse lithography for 45-nm-node contact holes at 1.35 numerical aperture," Journal of Micro/Nanolithography, MEMS, and MOEMS 8(4), 043001 (1 Oct. 2009). doi://10.1117/1.3263702

SUMMARY OF INVENTION

Technical Problem

The simplification method as described in Non-Patent Document 1 above can achieve simplification such that the shape is judged to be maintained in human vision. However, this method does not strictly maintain the positions and angles of the sides of an input polygon. This method is only intended to achieve a reasonably simplified appearance "in human vision" and does not pay much attention to the positions and angles of the shapes. As a result, the performance of the masks produced using this method is clearly degraded compared to that expected to be realized by performing OPC or the like. Many of the other known algorithms for simplifying two-dimensional figures are built on the basis of whether or not they are reasonable for human vision, and they cannot achieve both obtaining precise exposure patterns and reducing the data size of mask information.

It is also difficult for the configuration as described in Non-Patent Document 2 above to achieve both obtaining precise exposure patterns and reducing the data size of mask information.

In this manner, conventional techniques are problematic in that the data size of mask information that can produce precise exposure patterns is large. Although a smaller data size of mask information is preferable, there is a trade-off relationship in which, if the data granularity of curves is coarsened using usually conceivable methods, the performance of the photomask produced will deteriorate. Mask pattern simplification processing is needed to resolve this trade-off and achieve both small data size and high precision.

Solution to Problem

A first aspect of the present invention is directed to a mask information adjusting apparatus for adjusting mask information for use in production of a photomask, including: a subject information acquiring unit that acquires pre-adjustment mask information containing a polygonal mask pattern; a processing unit that acquires the degree of influence of removal of each vertex or side of the mask pattern, on an exposure pattern that is generated using a photomask corresponding to the mask pattern, in association with the vertex or point, and simplifies the mask pattern by removing each vertex or side according to whether or not a predetermined condition regarding the acquired degree of influence is satisfied; and an output unit that outputs post-adjustment mask information containing the mask pattern that has been simplified by the processing unit.

With this configuration, it is possible to reduce the data size of mask information while preventing a significant influence on an exposure pattern.

Furthermore, a second aspect of the present invention is directed to the mask information adjusting apparatus according to the first aspect, wherein the processing unit acquires the degrees of influence of all vertices or all sides of the mask pattern, and removes a vertex or point with the lowest degree of influence acquired.

With this configuration, it is possible to reduce the data size of mask information while further reducing the influence on an exposure pattern.

Furthermore, a third aspect of the present invention is directed to the mask information adjusting apparatus according to the first or second aspect, wherein the processing unit removes one vertex or side of the mask pattern, acquires the degree of influence of removal of each vertex or side of the mask pattern from which the one vertex or side has been removed, and further removes one vertex or side of the mask pattern based on the acquired degree of influence in a case in which a predetermined end condition is not satisfied or ends the simplification of the mask pattern in a case in which the predetermined end condition is satisfied.

With this configuration, the mask pattern after the removal is further subjected to acquisition of the degree of influence and removal of a vertex or side, and thus it is possible to effectively reduce the data size of mask information.

Furthermore, a fourth aspect of the present invention is directed to the mask information adjusting apparatus according to the third aspect, wherein the processing unit acquires the degree of influence of the mask pattern from which the one vertex or side has been removed, compares each degree of influence acquired and a predetermined threshold value, and ends the simplification of the mask pattern in a case in which a comparison result satisfies the end condition.

With this configuration, it is possible to effectively reduce the data size of mask information while preventing a significant influence on an exposure pattern.

Furthermore, a fifth aspect of the present invention is directed to the mask information adjusting apparatus according to any one of the first to fourth aspects, wherein, as the degree of influence of each vertex or side of the mask pattern, the processing unit acquires a value corresponding to the amount of change in an area of the mask pattern caused by removing the vertex or side.

With this configuration, it is possible to reduce the data size of mask information while reducing the influence of simplification of a mask pattern on an exposure pattern.

Furthermore, a sixth aspect of the present invention is directed to the mask information adjusting apparatus according to any one of the first to fifth aspects, wherein, as the degree of influence of one side constituting the mask pattern, the processing unit acquires an area of a triangle formed by the side and half-lines including adjacent sides that are each adjacent to the side and having start points at vertices that are different from vertices that are each shared with the side.

With this configuration, it is possible to reduce the data size of mask information while reducing the influence of simplification of a mask pattern on an exposure pattern.

Furthermore, a seventh aspect of the present invention is directed to the mask information adjusting apparatus according to any one of the first to sixth aspects, wherein, in a case of removing one side constituting the mask pattern, the processing unit sets, as a vertex in a mask pattern after the removal of the side, an intersection of half-lines including adjacent sides that are each adjacent to the side and having start points at vertices that are different from vertices that are each shared with the side.

With this configuration, it is possible to effectively reduce the data size of mask information while preventing a significant influence on an exposure pattern.

Furthermore, an eighth aspect of the present invention is directed to the mask information adjusting apparatus according to any one of the first to seventh aspects, wherein, as the degree of influence of one vertex constituting the mask pattern, the processing unit acquires an area of a quadrilateral formed by two sides that share the vertex and two half-lines including adjacent sides that are respectively adjacent to the two sides and having start points at vertices that are different from adjacent vertices that are each adjacent to the vertex, in a case in which the quadrilateral is not a concave quadrilateral.

With this configuration, it is possible to reduce the data size of mask information while reducing the influence of simplification of a mask pattern on an exposure pattern.

Furthermore, a ninth aspect of the present invention is directed to the mask information adjusting apparatus according to any one of the first to eighth aspects, wherein, in a case of removing one vertex constituting the mask pattern, in a case in which a quadrilateral formed by two sides that share the vertex and two half-lines including adjacent sides that are respectively adjacent to the two sides and having start points at vertices that are different from adjacent vertices that are each adjacent to the vertex is not a concave quadrilateral, the processing unit sets an intersection of the half-lines as a vertex in a mask pattern after the removal.

With this configuration, it is possible to effectively reduce the data size of mask information while preventing a significant influence on an exposure pattern.

Furthermore, a tenth aspect of the present invention is directed to the mask information adjusting apparatus according to any one of the first to ninth aspects, wherein, as the degree of influence of one vertex constituting the mask pattern, the processing unit acquires an area of a triangle formed by two sides that share the vertex and a segment that connects two adjacent vertices that are each adjacent to the vertex, in a case in which a quadrilateral formed by the two sides that share the vertex and two half-lines including adjacent sides that are respectively adjacent to the two sides and having start points at vertices that are different from the adjacent vertices is a concave quadrilateral.

With this configuration, it is possible to reduce the data size of mask information while reducing the influence of simplification of a mask pattern on an exposure pattern.

Furthermore, an eleventh aspect of the present invention is directed to the mask information adjusting apparatus according to any one of the first to tenth aspects, wherein, in a case of removing one vertex constituting the mask pattern, in a case in which a quadrilateral formed by two sides that share the vertex and two half-lines including adjacent sides that are respectively adjacent to the two sides and having start points at vertices that are different from adjacent vertices that are each adjacent to the vertex is a concave quadrilateral, the processing unit sets a first point that is located on one of the two half-lines and a second point that is located on the other half-line, as vertices in a mask pattern after the removal, and the first point and the second point are positioned such that an area of a quadrilateral formed by a segment that connects the first point and the second point, a segment that connects the adjacent vertices, and the two half-lines is equal to an area of a triangle formed by the two sides that share the vertex and a segment that connects the adjacent vertices.

With this configuration, it is possible to effectively reduce the data size of mask information while preventing a significant influence on an exposure pattern.

Furthermore, a twelfth aspect of the present invention is directed to the mask information adjusting apparatus according to any one of the first to eleventh aspects, wherein the pre-adjustment mask information contains a mask pattern generated through OPC (optical proximity effect correction).

With this configuration, it is possible to reduce the data size of mask information that can produce a precise exposure pattern.

Furthermore, a thirteenth aspect of the present invention is directed to the mask information adjusting apparatus according to any one of the first to twelfth aspects, wherein the subject information acquiring unit acquires a target mask pattern corresponding to a target exposure pattern, and acquires the pre-adjustment mask information based on the acquired target mask pattern.

With this configuration, it is possible to reduce the data size of mask information that can produce a precise exposure pattern.

Furthermore, a fourteenth aspect of the present invention is directed to the mask information adjusting apparatus according to any one of the first to twelfth aspects, further including a preparing unit that performs mask data preparation based on the post-adjustment mask information output by the output unit.

With this configuration, post-adjustment mask information with a relatively small data size is used, and thus it is possible to improve the production efficiency of photomasks.

Advantageous Effects of Invention

According to the mask information adjusting apparatus of the present invention, it is possible to reduce the data size of mask information while preventing a significant influence on an exposure pattern.

DESCRIPTION OF EMBODIMENT

Figure 1:
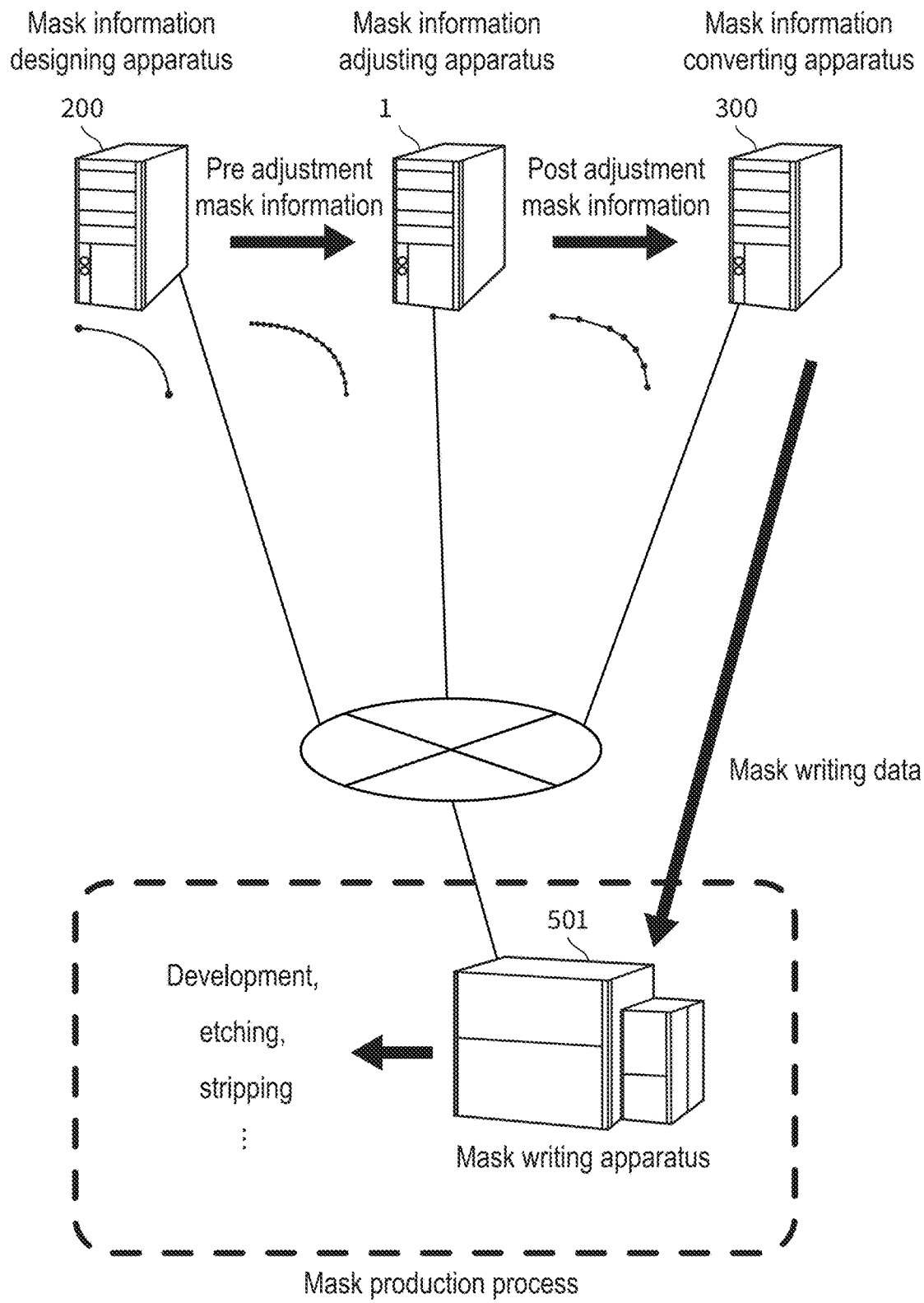
FIG. 1 is a diagram showing the schematic configuration of a photomask producing system in this embodiment.

Hereinafter, an embodiment of a mask information adjusting apparatus and the like will be described with reference to the drawings. It should be noted that constituent elements denoted by the same reference numerals in the embodiments perform similar operations, and thus a description thereof may not be repeated.

The terms used hereinafter are generally defined as follows. The meanings of these terms should not always be interpreted as indicated herein, but should be interpreted in light of, for example, individual explanations, if any, given below.

The acquiring may encompass acquiring matters input by a user or the like, or acquiring information stored in the apparatus or another apparatus (the information may be information stored in advance or generated through information processing performed by the apparatus).

The outputting information is a concept that encompasses display on a display screen, projection using a projector, printing by a printer, output of a sound, transmission to an external apparatus, accumulation in a recording medium, delivery of a processing result to another processing apparatus or another program, and the like.

The accepting information is a concept that encompasses accepting information input via an input device such as a keyboard, a mouse, or a touch panel, receiving information transmitted via a wired or wireless communication line from another apparatus or the like, and accepting information read from a recording medium such as an optical disk, a magnetic disk, or a semiconductor memory.

Embodiments

Hereinafter, the summary of this embodiment will be described. In this embodiment, a mask information adjusting apparatus 1 adjusts mask information for use in the production of photomasks. The mask information adjusting apparatus 1 is configured to acquire the degree of influence of removal of each vertex or side of a pre-adjustment mask pattern and simplify the pre-adjustment polygonal mask pattern by removing each vertex or side according to whether or not the acquired degree of influence satisfies a predetermined condition, and to output post-adjustment mask information containing a post-adjustment mask pattern that has been simplified.

In this embodiment, the degree of influence may be a value corresponding to the area changed by removing each vertex or side, for example. More specifically, for example, the degree of influence of one side can be the area of a triangle formed by the side and half-lines including adjacent sides that are each adjacent to the side and having start points at vertices that are different from vertices shared with the side. For example, the degree of influence of one vertex can be a value corresponding to the area of a quadrilateral formed by two sides that share the vertex and two half-lines, if the quadrilateral is not a concave quadrilateral. Alternatively, for example, the degree of influence of one vertex can be a value corresponding to the area of a triangle formed by two sides that share the vertex and a segment that connects two adjacent vertices, if the above-mentioned quadrilateral is a concave quadrilateral.

Furthermore, in this embodiment, in the case of removing one side, the intersection of the above-mentioned half-lines can be a vertex in a mask pattern after the removal. In the case of removing one vertex, if the quadrilateral is not a concave quadrilateral, the intersection of the above-mentioned half-lines can be a vertex in a mask pattern after the removal. On the other hand, in the case of removing one vertex, if the quadrilateral is a concave quadrilateral, a first point that is located on one of the two half-lines and a second point that is located on the other half-line can be vertices in a mask pattern after the removal.

Furthermore, in this embodiment, the pre-adjustment mask information may contain a pre-adjustment mask pattern generated through OPC, that is, a mask pattern corresponding to the target exposure pattern, for example. In other words, the mask information adjusting apparatus 1 may be configured to acquire and simplify pre-adjustment mask information containing a pre-adjustment polygonal mask pattern corresponding to a mask pattern optimized through OPC or the like (which may be a mask pattern itself optimized through OPC, or a mask pattern obtained by approximating a mask pattern constituted by curves obtained through ILT or the like to a polygon), for example.

Hereinafter, the configuration of a photomask producing system 900 including the thus configured mask information adjusting apparatus 1 will be described.

FIG. 1 is a diagram showing the schematic configuration of the photomask producing system 900 in this embodiment.

As shown in FIG. 1, in this embodiment, the photomask producing system 900 includes a mask information adjusting apparatus 1, a mask information designing apparatus 200, a mask information converting apparatus 300, and a mask writing apparatus 501. The photomask producing system 900 is used to produce photomasks. The apparatuses are communicably connected to each other via a network such as a LAN or the Internet, for example, but there is no limitation to this.

The mask information designing apparatus 200 is used after the logical and physical design of an integrated circuit has been performed. The mask information designing apparatus 200 generates and outputs mask information for producing a photomask, based on the physical design data of the integrated circuit. The output mask information is referred to here as pre-adjustment mask information. The physical design data (circuit pattern) of the integrated circuit can be said to be an ideal exposure pattern to be realized in the exposure step using the photomask produced by the photomask producing system 900. The mask information designing apparatus 200 generates a mask pattern optimized to produce an ideal exposure pattern, using a technology such as OPC or ILT, for example. Then, pre-adjustment mask information containing a polygonal mask pattern, which is the generated mask pattern or a mask pattern corresponding thereto, is output. There is no limitation on the level of optimization. In this embodiment, mask information containing a mask pattern constituted by curves may be output from the mask information designing apparatus 200, and converted by the mask information adjusting apparatus 1 to pre-adjustment mask information containing a polygonalized mask pattern.

In this embodiment, the mask information adjusting apparatus 1 acquires pre-adjustment mask information transmitted from the mask information designing apparatus 200. Then, the mask information adjusting apparatus 1 performs simplification processing on the mask pattern of the pre-adjustment mask information, and outputs post-adjustment mask information containing a simplified mask pattern. The simplification reduces the total number of vertices in the polygonal mask pattern.

The mask information converting apparatus 300 acquires the post-adjustment mask information transmitted from the mask information adjusting apparatus 1. Then, the mask information converting apparatus 300 performs mask data preparation (MDP) based on the post-adjustment mask information. Mask data preparation includes mask layout, data creation, and data format conversion so that the data can be used in subsequent steps, for example. Then, the mask information converting apparatus 300 outputs mask writing data generated through the mask data preparation.

The mask writing apparatus 501 is an apparatus included in the mask production process. The mask writing apparatus 501 has a known configuration and writes a simplified mask pattern and the like using a beam on a mask base plate according to the mask writing data transmitted from the mask information converting apparatus 300. Subsequently, in the mask production process, a photomask is produced through processes such as development, etching, and stripping.

Figure 2:
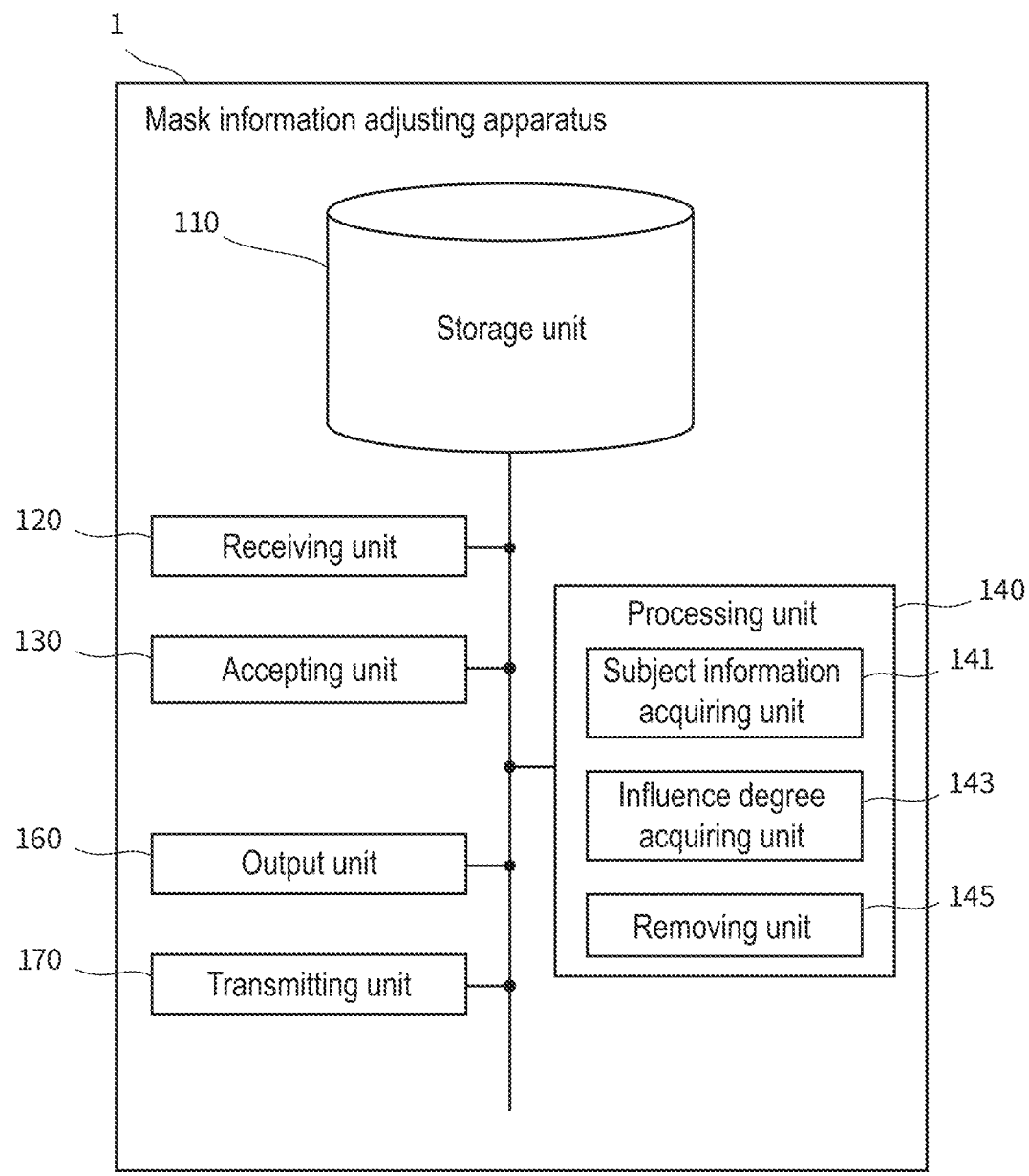
FIG. 2 is a block diagram of a mask information adjusting apparatus in this embodiment.
Figure 3:
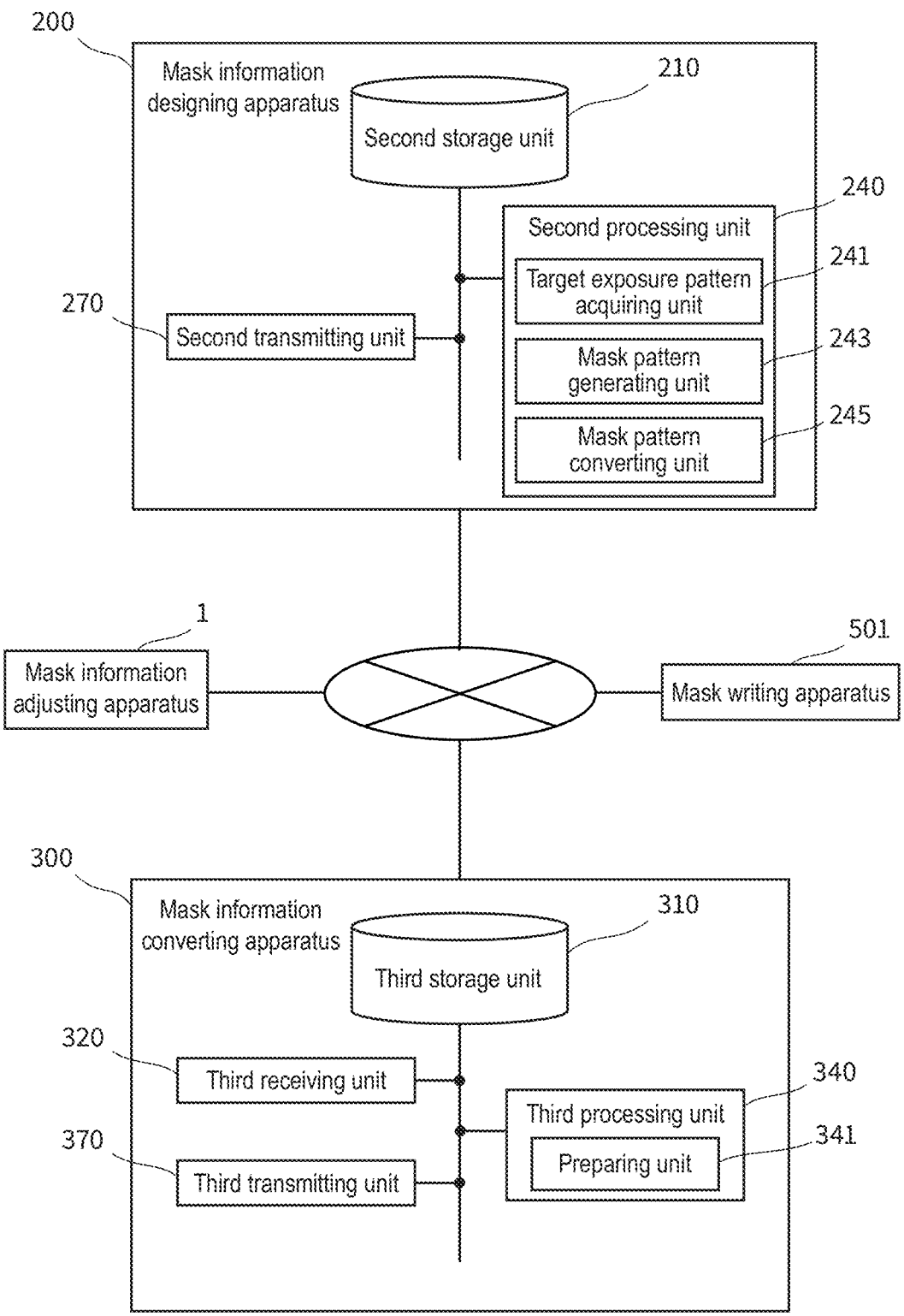
FIG. 3 is a block diagram of the photomask producing system in this embodiment.

FIG. 2 is a block diagram of the mask information adjusting apparatus 1. FIG. 3 is a block diagram of the photomask producing system 900.

As shown in FIG. 2, the mask information adjusting apparatus 1 includes a storage unit 110, a receiving unit 120, an accepting unit 130, a processing unit 140, an output unit 160, and a transmitting unit 170. The mask information adjusting apparatus 1 is a server apparatus with a general configuration, for example, but there is no limitation to this, and it may be an electronic computer in other forms, or an apparatus realized by multiple apparatuses connected to each other.

The storage unit 110 is preferably a non-volatile recording medium, but can also be realized by a volatile recording medium. Various types of information, programs, and the like are stored in the storage unit 110. In this embodiment, a program stored in the storage unit 110 prescribes a predetermined condition that is used in later-described simplification processing and regarding whether or not to remove a side or vertex of a mask pattern (which may be referred to as a "removal condition"). In a similar manner, a predetermined end condition is prescribed. The end condition is a condition that is used when the processing unit 140 performs the processing as described later, and, in this embodiment, it is a condition regarding a comparison result between the acquired degree of influence of each vertex or side and a predetermined threshold value, for example. The end condition may be prescribed with respect to factors other than the degree of influence, such as that the removal of a vertex or side has been performed a predetermined number of times (the number of loops of processing regarding the removal of a vertex or side has reached a predetermined number (N)), for example.

The receiving unit 120 receives information transmitted from another apparatus. The receiving unit 120 stores the received information in the storage unit 110, for example. In this embodiment, for example, pre-adjustment mask information transmitted from the mask information designing apparatus 200 is received.

The accepting unit 130 accepts information input using an unshown input part connected to the mask information adjusting apparatus 1. The accepting unit 130 stores the accepted information in the storage unit 110, for example. The input part may be any part such as a numeric keypad, a keyboard, a mouse, or a menu screen. The accepting unit 130 may accept information input through an input operation (e.g., which also includes information read using a device) performed using a reading device (e.g., code reader, etc.) connected to the mask information adjusting apparatus 1.

The processing unit 140 includes a subject information acquiring unit 141, an influence degree acquiring unit 143, and a removing unit 145. The processing unit 140 performs various types of processing. The various processing are processes that are performed by the units of the processing unit 140 as follows, for example.

The subject information acquiring unit 141 acquires pre-adjustment mask information containing a polygonal mask pattern stored in the storage unit 110. The polygonal mask pattern contained in the pre-adjustment mask information is subjected to the simplification processing. The subject information acquiring unit 141 may be configured to, if the mask information adjusting apparatus 1 acquires mask information containing a mask pattern constituted by curves from the mask information designing apparatus 200, perform processing for approximating the mask pattern constituted by curves to a polygonal mask pattern, thereby acquiring pre-adjustment mask information containing a mask pattern that is to be processed.

The influence degree acquiring unit 143 in this embodiment acquires the degree of influence of removal of each vertex or side of a polygonal mask pattern that is to be processed, as follows. The influence degree acquiring unit 143 acquires each degree of influence in association with a vertex or side. Specifically, each influence degree can be acquired by storing an identifier for identifying a vertex or side and the acquired degree of influence in association with each other in the storage unit 110, but various other methods can be employed.

In this embodiment, the degree of influence represents the degree of influence of removal of a vertex or side of a mask pattern, on an exposure pattern that is generated using a photomask corresponding to the mask pattern. The acquisition of the degree of influence will be described later.

The removing unit 145 removes a vertex or side based on the degree of influence acquired by the influence degree acquiring unit 143. In this embodiment, the removing unit 145 determines whether or not a predetermined removal condition regarding the degree of influence acquired by the influence degree acquiring unit 143 is satisfied. Then, the removing unit 145 removes each vertex or side according to a determination result as to whether or not the removal condition is satisfied, thereby simplifying the mask pattern. The removing unit 145 determines whether or not a predetermined end condition is satisfied, based on the degree of influence acquired by the influence degree acquiring unit 143. If the predetermined end condition is satisfied, the removing unit 145 does not remove the vertex or side, and ends the simplification of the mask pattern.

In this embodiment, the predetermined removal condition regarding the acquired degree of influence can be said to be a condition regarding a relationship between the degree of influence of each vertex or side and the degrees of influence of the other vertices or sides. Specifically, for example, the degree of influence of a vertex or side being the lowest among the degrees of influence acquired for vertices or sides can be the condition for removing the vertex or side. In other words, the degree of influence of a vertex or side being higher than the degree of influence of any other vertices or sides can be the condition for not selecting the vertex or side as a subject that is to be removed. The removal condition may be set such that a given number (two or more) vertices or sides with the lowest degree of influence are selected as subjects that are to be removed at a time.

Furthermore, in this embodiment, if all of the acquired degrees of influence are higher than the predetermined threshold value, it is determined that the predetermined end condition is satisfied. That is to say, in the case of comparing the acquired degree of influence of each vertex or side and the predetermined threshold value, the degrees of influence of all vertices and points being higher than the predetermined threshold value can be the predetermined end condition.

It may be interpreted that the removal condition includes the end condition, or that the removal condition and the end condition are different conditions.

More specifically, the processing unit 140 in this embodiment performs processing as follows. That is to say, the influence degree acquiring unit 143 acquires the degrees of influence of all vertices or all sides of a polygonal mask pattern that is to be processed. The removing unit 145 determines whether or not a comparison result between the acquired degree of influence of each vertex or side and the predetermined threshold value satisfies the predetermined end condition. If the end condition is not satisfied, the removing unit 145 removes a vertex or point with the lowest degree of influence acquired, that is, a vertex or point that satisfies the removal condition. Accordingly, a mask pattern after the removal is generated. Subsequently, the influence degree acquiring unit 143 acquires the degrees of influence of all vertices or all sides of the mask pattern after the removal. Then, the removing unit 145 performs determination regarding the end condition, and, if the end condition is not satisfied, the removing unit removes a vertex or point with the lowest degree of influence acquired, that is, a vertex or point that satisfies the removal condition. Accordingly, a mask pattern after the removal is further generated. In this manner, the processing unit 140 repeats acquisition of the degrees of influence of all vertices or all sides and removal of a vertex or side, until the end condition is satisfied.

In summary, in this embodiment, the processing unit 140 removes one vertex or side of the mask pattern, and acquires the degree of influence of removal of each vertex or side of the mask pattern from which the one vertex or side has been removed. If the predetermined end condition is not satisfied, the processing unit 140 removes one more vertex or side of the mask pattern according to whether or not the acquired degree of influence satisfies the removal condition. On the other hand, if the predetermined end condition is satisfied, the processing unit 140 ends the simplification of the mask pattern. More specifically, the processing unit 140 acquires the degree of influence of a mask pattern from which one vertex or side has been removed, and then compares each degree of influence acquired and the predetermined threshold value. If the comparison result satisfies a predetermined end condition, the processing unit 140 ends the simplification of the mask pattern.

The output unit 160 outputs information by transmitting the information to another apparatus using the transmitting unit 170 or the like. The output method is not limited to this, and the information may be output by displaying the information on a display device provided in the mask information adjusting apparatus 1, for example. The information may be stored in the storage unit 110 or the like such that it can be processed by the processing unit 140 in the mask information adjusting apparatus 1. The output unit 160 may be considered to include or to not include an output device such as a display screen or a speaker. The output unit 160 may be realized by driver software for an output device, a combination of driver software for an output device and the output device, or the like.

In this embodiment, the output unit 160 outputs post-adjustment mask information containing the mask pattern that has been simplified by the processing unit 140.

The transmitting unit 170 transmits information via a network or the like to another apparatus constituting the mask information adjusting apparatus 1. For example, the transmitting unit 170 transmits information that is to be output to the mask information converting apparatus 300 or another apparatus.

Next, the configuration of the mask information designing apparatus 200 and the mask information converting apparatus 300 will be described.

The mask information designing apparatus 200 and the mask information converting apparatus 300 are server apparatuses with a general configuration, for example, but there is no limitation to this, and they may be electronic computers in other forms, or apparatuses realized by multiple apparatuses connected to each other. The mask information designing apparatus 200 and the mask information converting apparatus 300 are configured to be connectable to a network and communicable with other apparatuses connected to the network.

As shown in FIG. 3, the mask information designing apparatus 200 includes a second storage unit 210, a second processing unit 240, and a second transmitting unit 270. Various types of information, programs, and the like are stored in the second storage unit 210.

The second processing unit 240 includes a target exposure pattern acquiring unit 241, a mask pattern generating unit 243, and a mask pattern converting unit 245. As shown in the description below, in this embodiment, the second processing unit 240 acquires a target mask pattern corresponding to a target exposure pattern. The second processing unit 240 acquires pre-adjustment mask information containing a polygonal mask pattern based on the acquired target mask pattern.

The target exposure pattern acquiring unit 241 acquires information representing an exposure pattern expected to be obtained using a photomask produced by the photomask producing system 900. In other words, the target exposure pattern acquiring unit 241 acquires information representing a target exposure pattern. In this embodiment, the target exposure pattern is the same as the designed circuit pattern (a semiconductor device producing process using a photomask), but there is no limitation to this.

The mask pattern generating unit 243 generates a target mask pattern corresponding to a target exposure pattern, based on the target exposure pattern acquired by the target exposure pattern acquiring unit 241. In this embodiment, the target mask pattern is an ideal mask pattern optimized using a known OPC technology to obtain the target exposure pattern. Specifically, for example, the mask pattern generating unit 243 generates an ideal mask pattern corresponding to the target exposure pattern, using a known ILT technology. Such an ideal mask pattern contains a curve.

The mask pattern converting unit 245 converts the target mask pattern generated by the mask pattern generating unit 243 to a polygonal mask pattern. Accordingly, the second processing unit 240 acquires pre-adjustment mask information containing a polygonal mask pattern. The polygonal mask pattern has a relatively large number of vertices and sides that are approximated to correspond to the target exposure pattern.

The second transmitting unit 270 transmits information via a network or the like to another apparatus constituting the mask information adjusting apparatus 1. In this embodiment, the second transmitting unit 270 transmits pre-adjustment mask information containing the polygonal mask pattern converted by the mask pattern converting unit 245, to the mask information adjusting apparatus 1.

The mask information converting apparatus 300 includes a third storage unit 310, a third receiving unit 320, a third processing unit 340, and a third transmitting unit 370. Various types of information, programs, and the like are stored in the third storage unit 310.

The third receiving unit 320 receives information such as the post-adjustment mask information transmitted from the mask information adjusting apparatus 1, via a network. The third receiving unit 320 accumulates the received information in the third storage unit 310, for example, so that it can be used for processing by the third processing unit 340 and the like.

The third processing unit 340 includes a preparing unit 341. The third processing unit 340 performs various types of processing.

The preparing unit 341 performs mask data preparation as described above based on the post-adjustment mask information output by the mask information adjusting apparatus 1. Accordingly, for example, mask writing data and the like are generated.

The third transmitting unit 370 transmits the mask writing data generated through the mask data preparation to the mask writing apparatus 501. Accordingly, the mask writing apparatus 501 can perform beam irradiation along a shape corresponding to the simplified mask pattern.

The processing unit 140, the second processing unit 240, and the third processing unit 340 described above may be typically realized by MPUs, memories, or the like. Typically, the processing procedure of the processing unit 140, the second processing unit 240, and the third processing unit 340 is realized by software, and the software is stored in a recording medium such as a ROM. Note that the processing procedure may be realized by hardware (dedicated circuits).

Furthermore, the receiving unit 120 and the third receiving unit 320 are typically realized by wired or wireless communication parts, but may also be realized by broadcast receiving parts.

Furthermore, the transmitting unit 170, the second transmitting unit 270, and the third transmitting unit 370 are typically realized by wired or wireless communication parts, but may also be realized by broadcasting parts.

Each of the mask information adjusting apparatus 1, the mask information designing apparatus 200, and the mask information converting apparatus 300 may be constituted by a single server, multiple servers that operate in cooperation with each other, or a computer or the like built into other apparatuses. It will be appreciated that the server may be a so-called cloud server, an ASP server, or the like, and there is no limitation on the type thereof.

In this embodiment, it can be said that the influence degree acquiring unit 143 acquires, as the degree of influence of each vertex or side of the mask pattern, a value corresponding to the amount of change in an area of the mask pattern caused by removing the vertex or side. Specifically, the degree of influence of one side constituting the mask pattern and the degree of influence of one vertex constituting the mask pattern are acquired as follows.

In this embodiment, the influence degree acquiring unit 143 acquires, as the degree of influence of one side constituting the mask pattern, an area of a triangle formed by the side and half-lines including adjacent sides that are each adjacent to the side and having start points at vertices that are different from vertices that are each shared with the side.

Figure 4:
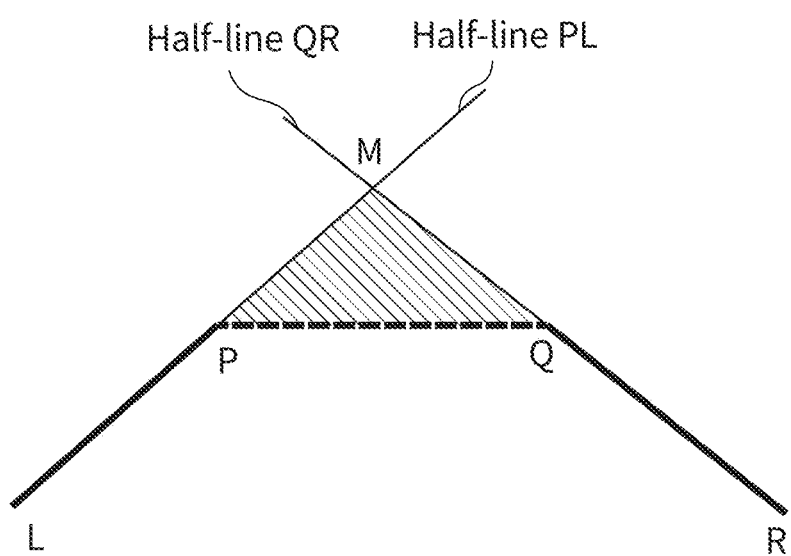
FIG. 4 is a first diagram illustrating acquisition of the degree of influence of one side and removal of the side in the mask information adjusting apparatus in this embodiment.

FIG. 4 is a first diagram illustrating acquisition of the degree of influence of one side and removal of the side in the mask information adjusting apparatus 1.

FIG. 4 shows a series of vertices constituting part of a polygonal mask pattern. The series of vertices is referred to as L-P-Q-R. Focusing on a side PQ indicated by the broken line, the area of a triangle PQM (the area of the hatched portion in the figure) formed by the side PQ, a half-line QR, and a half-line PL is acquired as the degree of influence. The half-lines QR and PL include adjacent sides LP and QR that are each adjacent to the side PQ, and have start points at vertices L and R that are different from the vertices P and Q that are each shared with the side PQ. A vertex M of the triangle PQM is the intersection of the half-line PL obtained by extending the adjacent side LP and the half-line QR obtained by extending the adjacent side QR.

In the case of removing the side PQ, the corresponding portion in a mask pattern after the removal has a shape constituted by the half-line PL, the half-line QR, and the vertex M. In the case of removing one side PQ constituting the mask pattern, the removing unit 145 sets, as a vertex in a mask pattern after the removal of the side PQ, the intersection M of the half-lines QR and PL including the adjacent sides LP and QR that are each adjacent to the side PQ and having start points at vertices L and R that are different from the vertices P and Q that are each shared with the side PQ. Accordingly, a series of vertices of the corresponding portion in a mask pattern after the removal can be said to be L-M-R.

Figure 5:
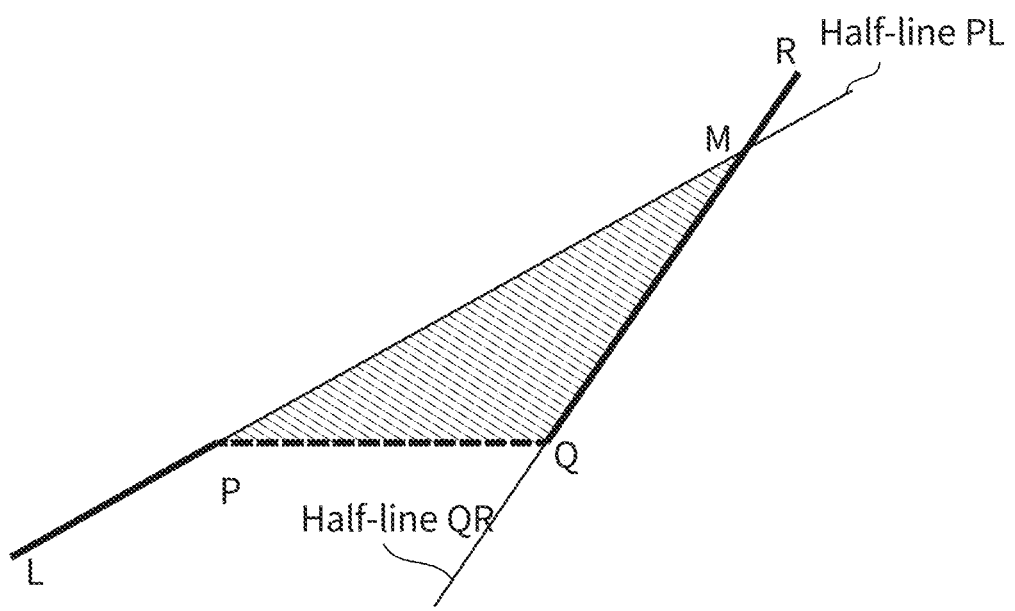
FIG. 5 is a second diagram illustrating acquisition of the degree of influence of one side and removal of the side in the mask information adjusting apparatus in this embodiment.

FIG. 5 is a second diagram illustrating acquisition of the degree of influence of one side and removal of the side in the mask information adjusting apparatus 1.

Also in a portion with a shape including a series of vertices L-P-Q-R as shown in FIG. 5, acquisition of the degree of influence of a side PQ and removal of the side can be explained as in the description above. That is to say, in this case as well, the area of the triangle PQM is acquired as the degree of influence of the side PQ. In the case of removing the side PQ, a series of vertices of the corresponding portion in a mask pattern after the removal is L-M-R.

Figure 6:
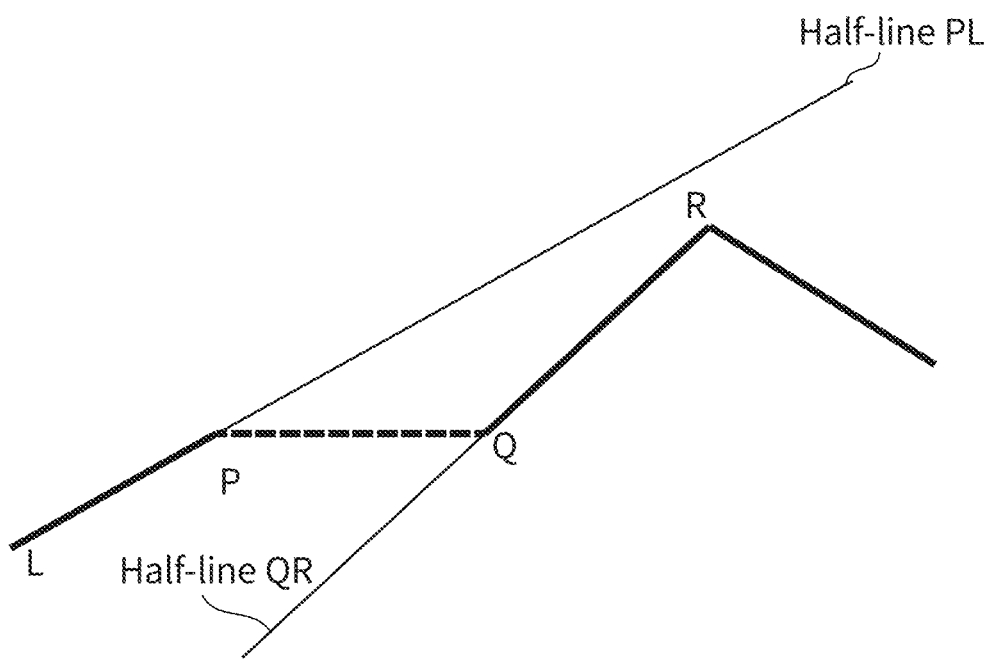
FIG. 6 is a third diagram illustrating acquisition of the degree of influence of one side and removal of the side in the mask information adjusting apparatus in this embodiment.

FIG. 6 is a third diagram illustrating acquisition of the degree of influence of one side and removal of the side in the mask information adjusting apparatus 1.

Depending on the shape of the mask pattern, there may be a case as shown in FIG. 6. That is to say, when focusing on a side PQ in a series of vertices L-P-Q-R, there may be a case in which a half-line PL including one adjacent side LP that is adjacent to the side PQ and having a start point at a vertex L that is different from a vertex P that is shared with the side PQ and a half-line QR including the other adjacent side QR that is adjacent to the side PQ and having a start point at a vertex R that is different from a vertex Q that is shared with the side PQ do not intersect each other. In this manner, if a triangle is not formed by the side PQ, the half-line QR, and the half-line PL, the degree of influence may be interpreted as infinite. That is to say, in this case, the side PQ is not a subject that is to be removed.

Furthermore, in this embodiment, the influence degree acquiring unit 143 acquires the degree of influence of one vertex constituting the mask pattern according to whether or not a quadrilateral formed by two sides that share the vertex and two half-lines including adjacent sides that are respectively adjacent to the two sides and having start points at vertices that are different from adjacent vertices that are each adjacent to the vertex (hereinafter, simply referred to as a "focused quadrilateral corresponding to the vertex") is a concave quadrilateral (a quadrilateral having a vertex with an interior angle of more than 180 degrees. That is to say, if a focused quadrilateral corresponding to the vertex is not a concave quadrilateral, the influence degree acquiring unit 143 acquires the area of the focused quadrilateral as the degree of influence. On the other hand, if the focused quadrilateral corresponding to the vertex is a concave quadrilateral, the influence degree acquiring unit 143 acquires the area of a triangle formed by the two sides that share the vertex and a segment that connects the two adjacent vertices, as the degree of influence.

A focused quadrilateral being not a concave quadrilateral can be said to be the same as the two diagonals of the focused quadrilateral intersecting each other. That is to say, it can be said that the influence degree acquiring unit 143 acquires the degree of influence of the vertex according to whether or not the two diagonals of the focused quadrilateral intersect each other.

Furthermore, there may be a case in which two half-lines including adjacent sides of one vertex and having start points at vertices that are different from adjacent vertices that are each adjacent to the vertex do not intersect each other. In this case, a focused quadrilateral is not formed. In this manner, if two half-lines do not intersect each other and a focused quadrilateral is not formed, the degree of influence may be interpreted as infinite. That is to say, in this case, the vertex is not a subject that is to be removed.

Figure 7:
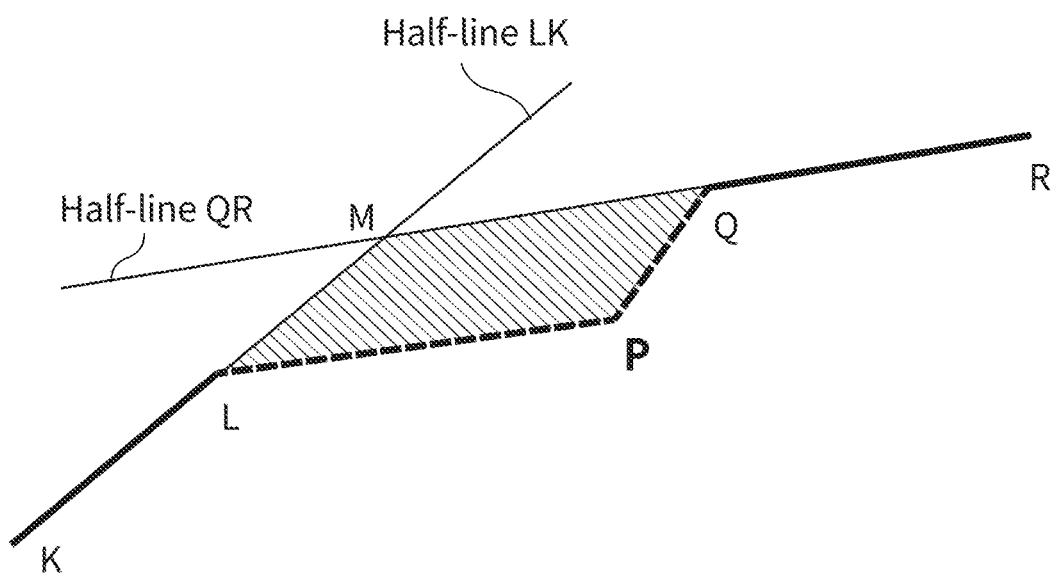
FIG. 7 is a first diagram illustrating acquisition of the degree of influence of one vertex and removal of the vertex in the mask information adjusting apparatus in this embodiment.

FIG. 7 is a first diagram illustrating acquisition of the degree of influence of one vertex and removal of the vertex in the mask information adjusting apparatus 1.

FIG. 7 shows a series of vertices constituting part of a polygonal mask pattern. The series of vertices is referred to as K-L-P-Q-R. In this example, a vertex P is focused on. In this case, vertices L and Q that are each adjacent to the vertex P are referred to as adjacent vertices. The focused quadrilateral corresponding to the vertex P is a quadrilateral PQML (the hatched portion in the figure) formed by sides PL and PQ (indicated by the broken lines) that share the vertex P, a half-line LK including an adjacent side KL that is adjacent to the side PL and having a start point at a vertex K that is different from the adjacent vertex L, and a half-line QR including an adjacent side QR that is adjacent to the side PQ and having a start point at a vertex R that is different from the adjacent vertex Q. A vertex M of the focused quadrilateral PQML is the intersection of the half-lines LK and QR.

In the case shown in FIG. 7, the focused quadrilateral PQML is not a concave quadrilateral. That is to say, diagonals PM and QL of the focused quadrilateral PQML intersect each other. Accordingly, the area of the focused quadrilateral PQML is acquired as the degree of influence.

In the case of removing the vertex P, the corresponding portion in a mask pattern after the removal has a shape constituted by the half-line LK, the half-line QR, and the vertex M. That is to say, in the case of removing one vertex P constituting the mask pattern, if the focused quadrilateral PQML is not a concave quadrilateral, the removing unit 145 sets the intersection M of the half-lines LK and QR as a vertex in a mask pattern after the removal. Accordingly, a series of vertices of the corresponding portion in a mask pattern after the removal can be said to be K-M-R.

Figure 8:
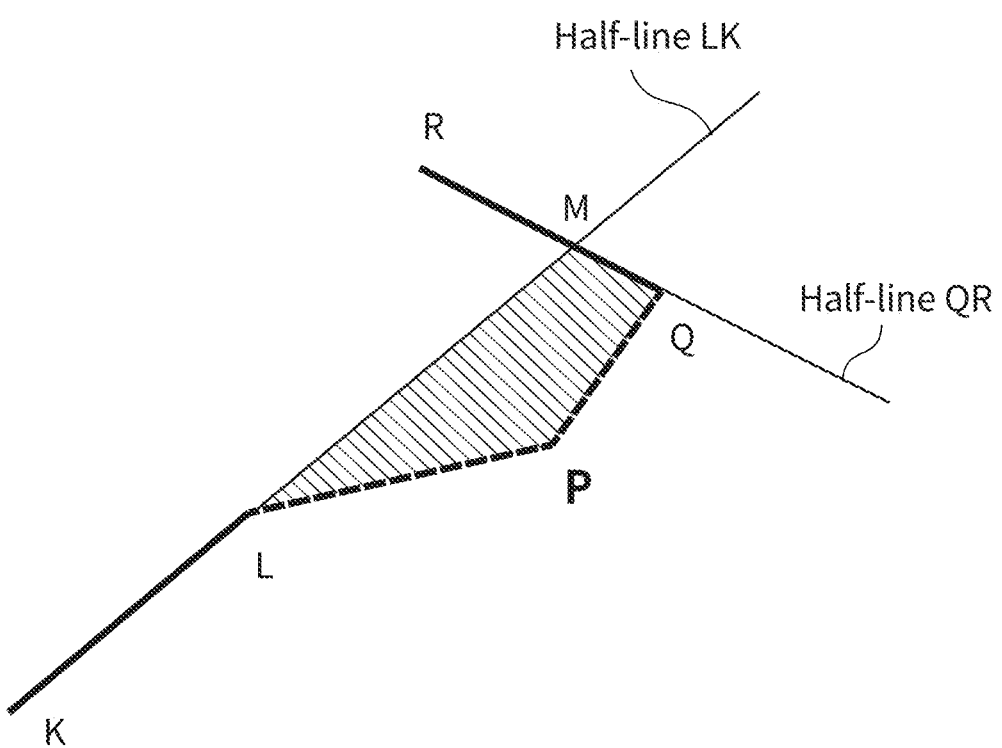
FIG. 8 is a second diagram illustrating acquisition of the degree of influence of one vertex and removal of the vertex in the mask information adjusting apparatus in this embodiment.

FIG. 8 is a second diagram illustrating acquisition of the degree of influence of one vertex and removal of the vertex in the mask information adjusting apparatus 1.

Also in a portion with a shape including a series of vertices K-L-P-Q-R as shown in FIG. 8, acquisition of the degree of influence of a vertex P and removal of the side can be explained as in the description above. That is to say, in this case as well, a quadrilateral PQML serving as a focused quadrilateral is not a concave quadrilateral. Accordingly, the area of the focused quadrilateral PQML is acquired as the degree of influence of the vertex P. In the case of removing the vertex P, a series of vertices of the corresponding portion in a mask pattern after the removal is K-M-R.

Figure 9:
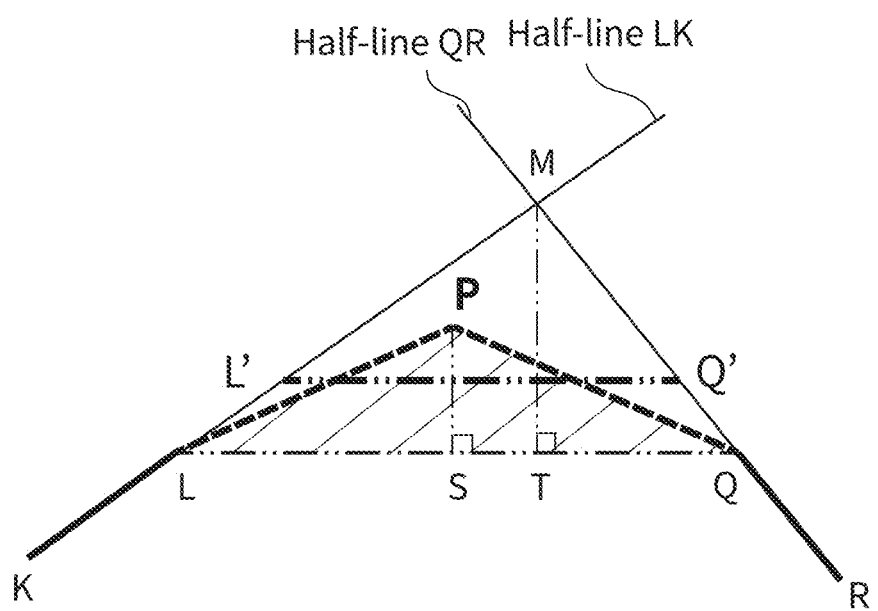
FIG. 9 is a third diagram illustrating acquisition of the degree of influence of one vertex and removal of the vertex in the mask information adjusting apparatus in this embodiment.

FIG. 9 is a third diagram illustrating acquisition of the degree of influence of one vertex and removal of the vertex in the mask information adjusting apparatus 1.

In a series of vertices K-L-P-Q-R constituting part of a polygonal mask pattern as shown in FIG. 9, a vertex P is focused on. In this case, a quadrilateral PQML is a focused quadrilateral. The focused quadrilateral PQML shown in FIG. 9 is a concave quadrilateral. That is to say, diagonals PM and QL of the focused quadrilateral PQML do not intersect each other. If the focused quadrilateral PQML is a concave quadrilateral in this manner, the area of a triangle PQL (the area of the hatched portion in the figure) formed by sides PL and PQ that each include the vertex P and a segment LQ that connects two adjacent vertices L and Q is acquired as the degree of influence.

In this embodiment, in the case of removing one vertex P constituting the mask pattern, the removing unit 145 preferably sets, as vertices in a mask pattern after the removal, a first point L' that is located on a half-line LK, which is one of the two half-lines, and a second point Q' that is located on a half-line QR, which is the other half-line, in the corresponding portion in the mask pattern after the removal. In this case, a series of vertices of the corresponding portion in a mask pattern after the removal may be K-L'-Q'-R. In this case, the positions of the first point L' and the second point Q' are preferably set such that the area of a quadrilateral LL'Q'Q formed by a segment L'Q' that connects the first point L' and the second point Q', a segment LQ that connects the adjacent vertices L and Q, the half-line LK, and the half-line QR is equal to the area of a triangle PQL. If the first point L' and the second point Q' are set as vertices in a mask pattern after the removal in this manner, the influence of removal of a vertex can be reduced.

In the case of removing one vertex P constituting the mask pattern in this manner, if the focused quadrilateral PQML is a concave quadrilateral, the removing unit 145 may set a series of vertices of the corresponding portion in a mask pattern after the removal of the vertex P to K-L-Q-R.

If the focused quadrilateral PQML is a concave quadrilateral as shown in FIG. 9, the intersections of perpendiculars from the vertices P and M to the straight line LQ, and the straight line LQ are respectively taken as S and T. If the vertices S and T are not located on the segment LQ, the vertex P is not removed. If the segment MT is shorter than the segment PS as well, the vertex P is not removed. In this case, the degree of influence may be interpreted as infinite.

Hereinafter, an example of the flow of processing performed by the mask information designing apparatus 200, the mask information adjusting apparatus 1, and the mask information converting apparatus 300 will be described.

Figure 10:
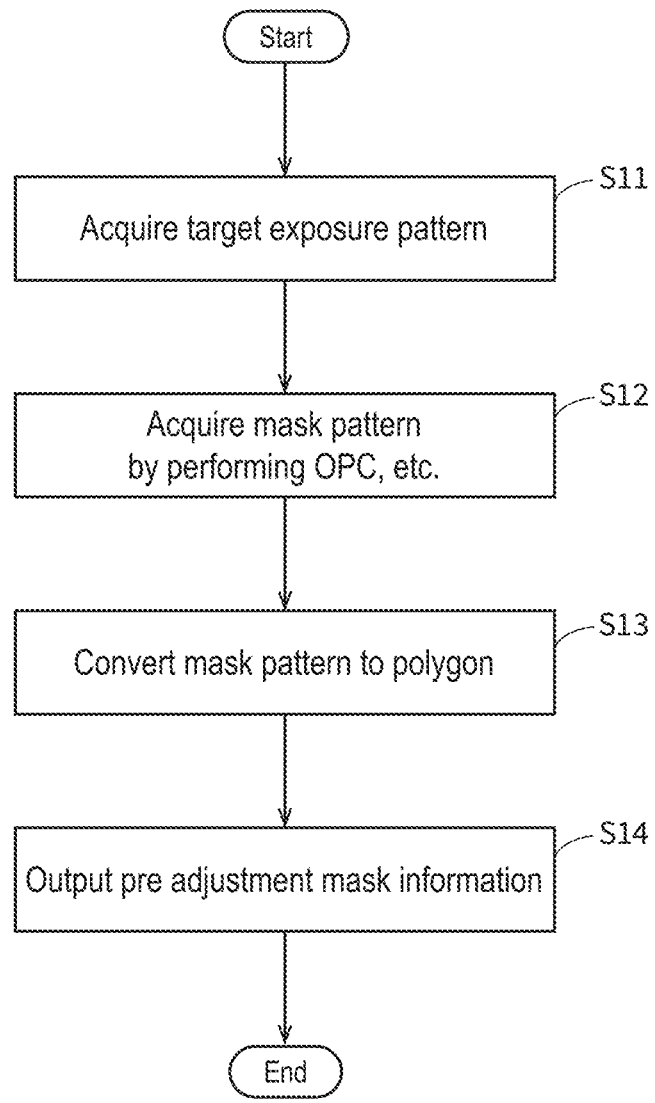
FIG. 10 is a flowchart showing an example of the operation of a mask information designing apparatus in this embodiment.

FIG. 10 is a flowchart showing an example of the operation of the mask information designing apparatus 200.

(Step S11) The target exposure pattern acquiring unit 241 acquires information representing a target exposure pattern serving as a target.

(Step S12) The mask pattern generating unit 243 acquires a target mask pattern corresponding to the target exposure pattern by performing OPC or the like.

(Step S13) The mask pattern converting unit 245 converts the acquired mask pattern to a polygonal mask pattern. Accordingly, the second processing unit 240 acquires pre-adjustment mask information containing the polygonal mask pattern.

(Step S14) The second transmitting unit 270 outputs the pre-adjustment mask information containing the polygonal mask pattern. That is to say, the second transmitting unit 270 transmits the pre-adjustment mask information to the mask information adjusting apparatus 1.

Figure 11:
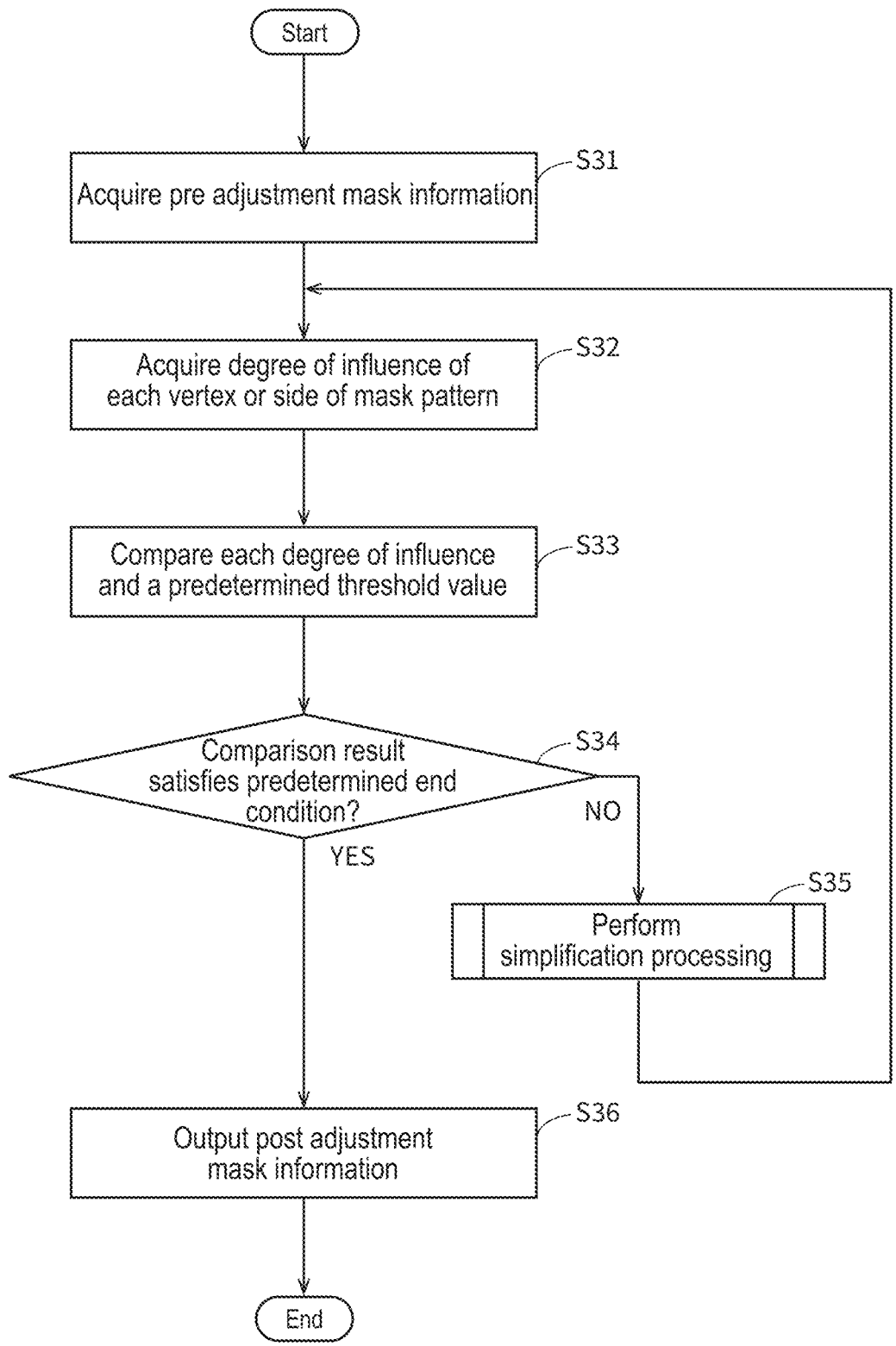
FIG. 11 is a flowchart showing an example of the operation of the mask information adjusting apparatus in this embodiment.

FIG. 11 is a flowchart showing an example of the operation of the mask information adjusting apparatus 1.

(Step S31) The subject information acquiring unit 141 acquires pre-adjustment mask information containing a polygonal mask pattern. The pre-adjustment mask information is received by the receiving unit 120 and stored in the storage unit 110, for example.

(Step S32) The influence degree acquiring unit 143 acquires the degree of influence of each vertex or side of the polygonal mask pattern that is to be processed. As described above, the method for acquiring the degree of influence is different between the degree of influence of a vertex and the degree of influence of a side, and the method for acquiring the degree of influence of a vertex is different depending on whether or not the focused quadrilateral is a concave quadrilateral, but a description thereof has been omitted. In the case of performing step S32 for the second time or more, the influence degree acquiring unit 143 may acquire the degrees of influence of only vertices or sides whose degree of influence changes in accordance with a change in the shape of the mask pattern from when the degree of influence was acquired in the previous time, or may acquire the degrees of influence of all vertices or sides every time step S32 is performed.

(Step S33) The removing unit 145 compares the acquired degree of influence of each vertex or side and a predetermined threshold value.

(Step S34) The removing unit 145 determines whether or not a comparison result satisfies a predetermined end condition. In this embodiment, the removing unit 145 determines whether or not the degrees of influence of all vertices and points are larger than the predetermined threshold value (whether or not there is any vertex or point whose degree of influence is smaller than the predetermined threshold value). If it is determined that the comparison result satisfies the predetermined end condition, the procedure advances to step S36. Otherwise, the procedure advances to step S35.

(Step S35) The removing unit 145 performs simplification processing. The flow of the simplification processing will be described later. Subsequently, the procedure returns to step S32.

(Step S36) The output unit 160 outputs post-adjustment mask information containing the mask pattern that has been simplified by the processing unit 140. Accordingly, the post-adjustment mask information is transmitted to the mask information converting apparatus 300.

Figure 12:
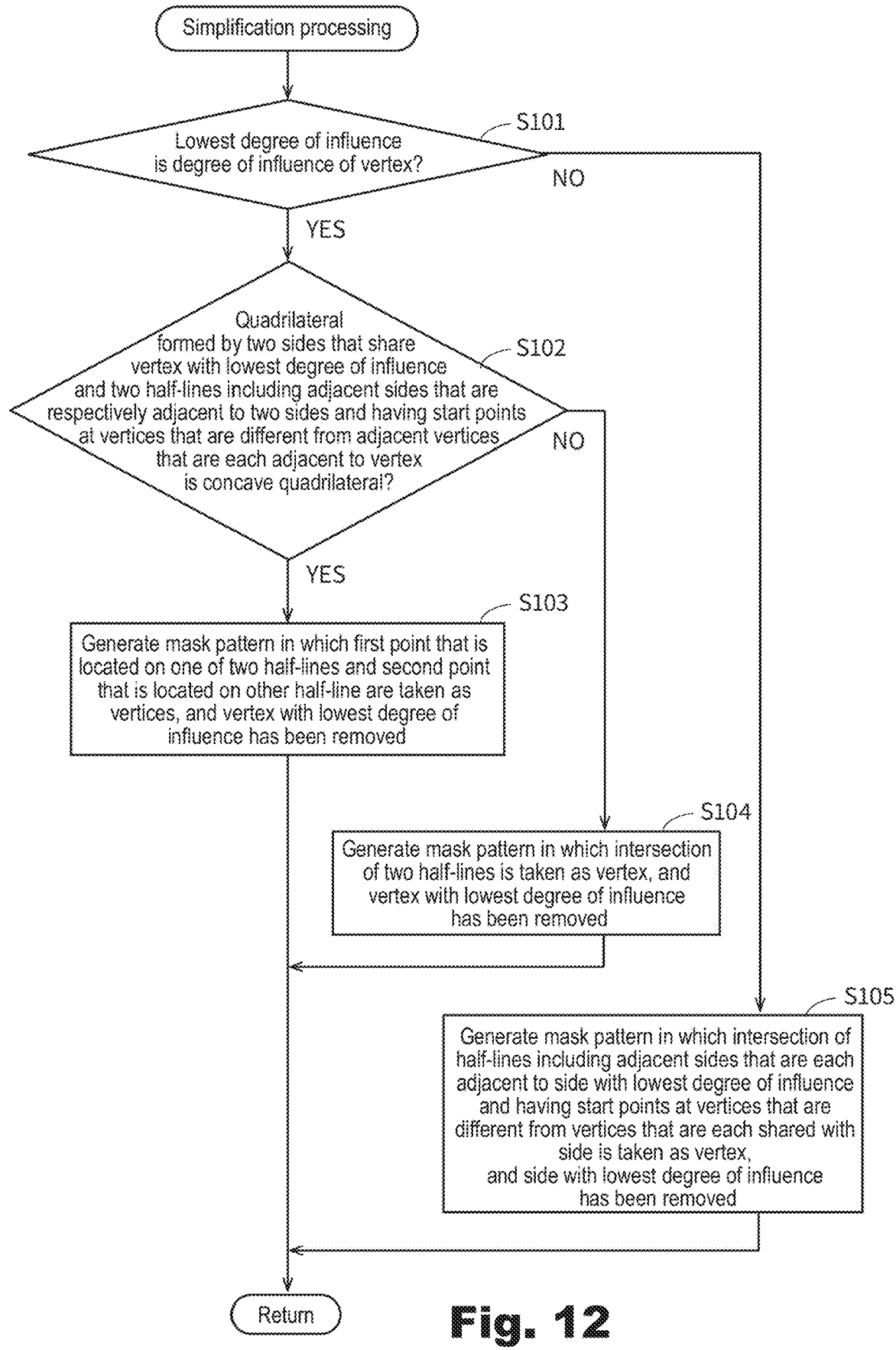
FIG. 12 is a flowchart showing an example of the simplification processing of the mask information adjusting apparatus in this embodiment.

FIG. 12 is a flowchart showing an example of the simplification processing of the mask information adjusting apparatus 1.

(Step S101) The removing unit 145 determines whether or not the lowest degree of influence in the mask pattern that is to be processed is the degree of influence of a vertex. If the lowest degree of influence is the degree of influence of a vertex, the procedure advances to step S102. Otherwise, that is, if the lowest degree of influence is the degree of influence of a side, the procedure advances to step S105.

(Step S102) The removing unit 145 starts processing for removing a vertex with the lowest degree of influence. That is to say, first, the removing unit 145 determines whether or not a focused quadrilateral with respect to the vertex with the lowest degree of influence is a concave quadrilateral. If the focused quadrilateral is a concave quadrilateral, the procedure advances to step S103. Otherwise, the procedure advances to step S104.

(Step S103) The removing unit 145 generates a mask pattern in which a first point that is located on one of the two half-lines and a second point that is located on the other half-line are taken as vertices, and the vertex with the lowest degree of influence has been removed, as described above.

(Step S104) On the other hand, the removing unit 145 generates a mask pattern in which the intersection of the two half-lines is taken as a vertex, and the vertex with the lowest degree of influence has been removed, as described above.

After the vertex with the lowest degree of influence has been removed in this manner, the procedure returns to FIG. 11.

(Step S105) The removing unit 145 performs processing for removing a side with the lowest degree of influence. That is to say, the removing unit 145 generates a mask pattern in which the intersection of half-lines including adjacent sides that are each adjacent to the side with the lowest degree of influence and having start points at vertices that are different from vertices that are each shared with the side is taken as a vertex, and the side with the lowest degree of influence has been removed.

After the side with the lowest degree of influence has been removed in this manner, the procedure returns to FIG. 11.

Figure 13:
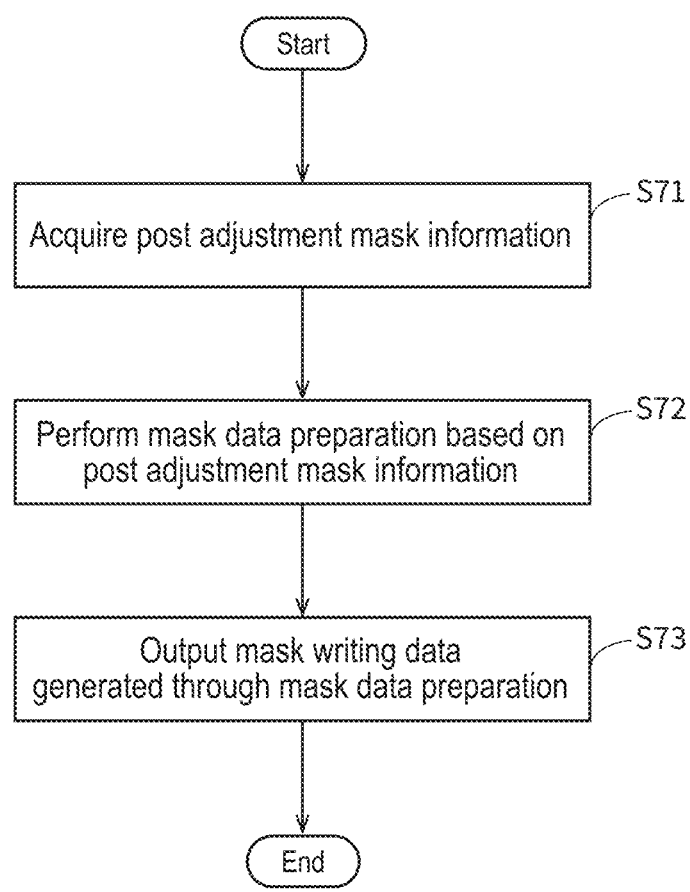
FIG. 13 is a flowchart showing an example of the operation of a mask information converting apparatus in this embodiment.

FIG. 13 is a flowchart showing an example of the operation of the mask information converting apparatus 300.

(Step S71) The third processing unit 340 acquires post-adjustment mask information. The post-adjustment mask information is received by the third receiving unit 320 and stored in the third storage unit 310, for example.

(Step S72) The preparing unit 341 performs mask data preparation based on the post-adjustment mask information.

(Step S73) The third transmitting unit 370 transmits the mask writing data generated through the mask data preparation to the mask writing apparatus 501.

After such processing has been performed, the processing by the mask writing apparatus 501 using the mask writing data can be started.

Hereinafter, an example of the simplification of the mask pattern using a method according to this embodiment will be described.

Figure 14:
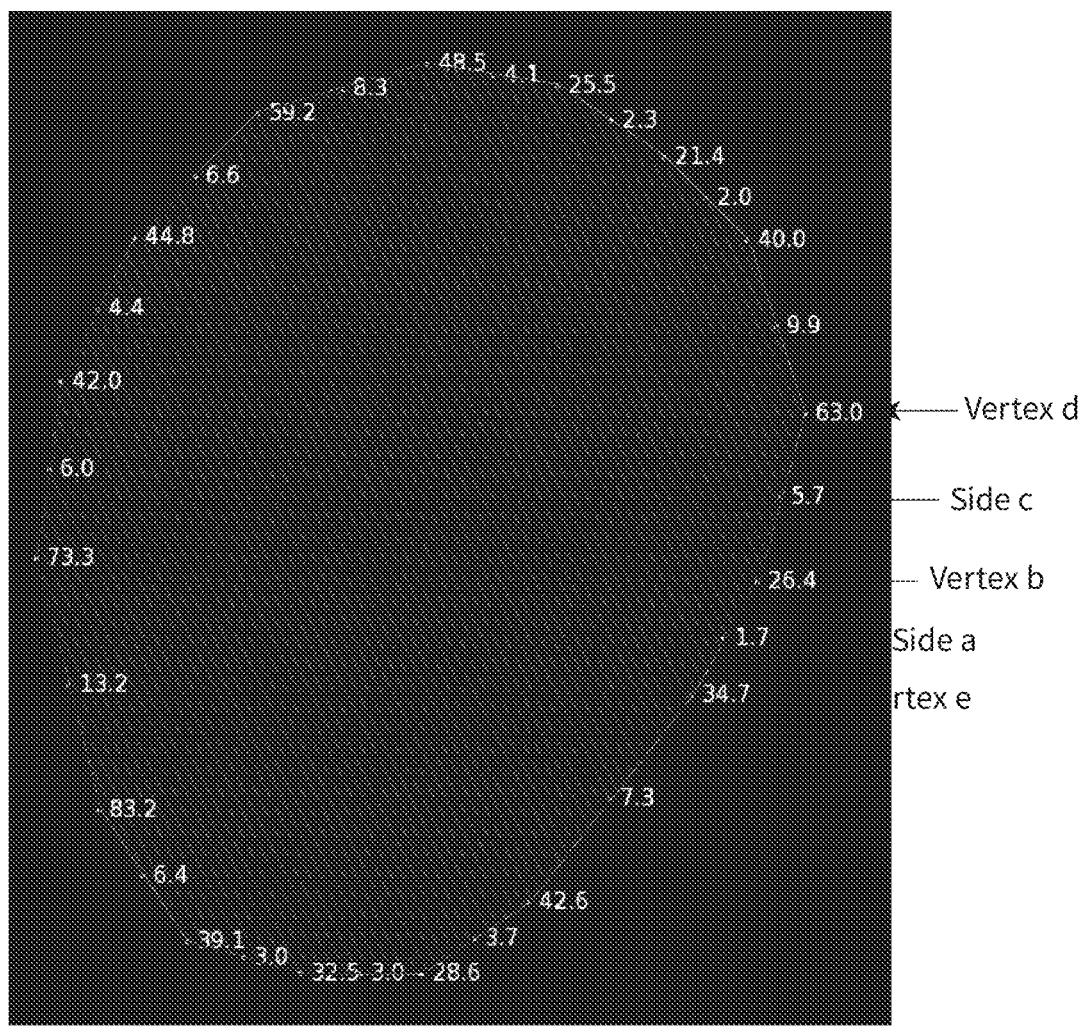
FIG. 14 is a first diagram showing an example of the simplification processing of the mask information adjusting apparatus in this embodiment.

FIG. 14 is a first diagram showing an example of the simplification processing of the mask information adjusting apparatus 1.

First, the degrees of influence of all sides and vertices in a mask pattern (one polygon is shown as an example) are calculated. In FIG. 14, the degree of influence acquired for each vertex or side of the mask pattern is shown as an example is shown next to that vertex or side.

Next, a side or vertex with the lowest degree of influence out of all sides and vertices of the mask pattern, that is, a side a (degree of influence=1.7) is removed. The vertices and sides around the side a are respectively referred to those as shown in the drawing.

Figure 15:
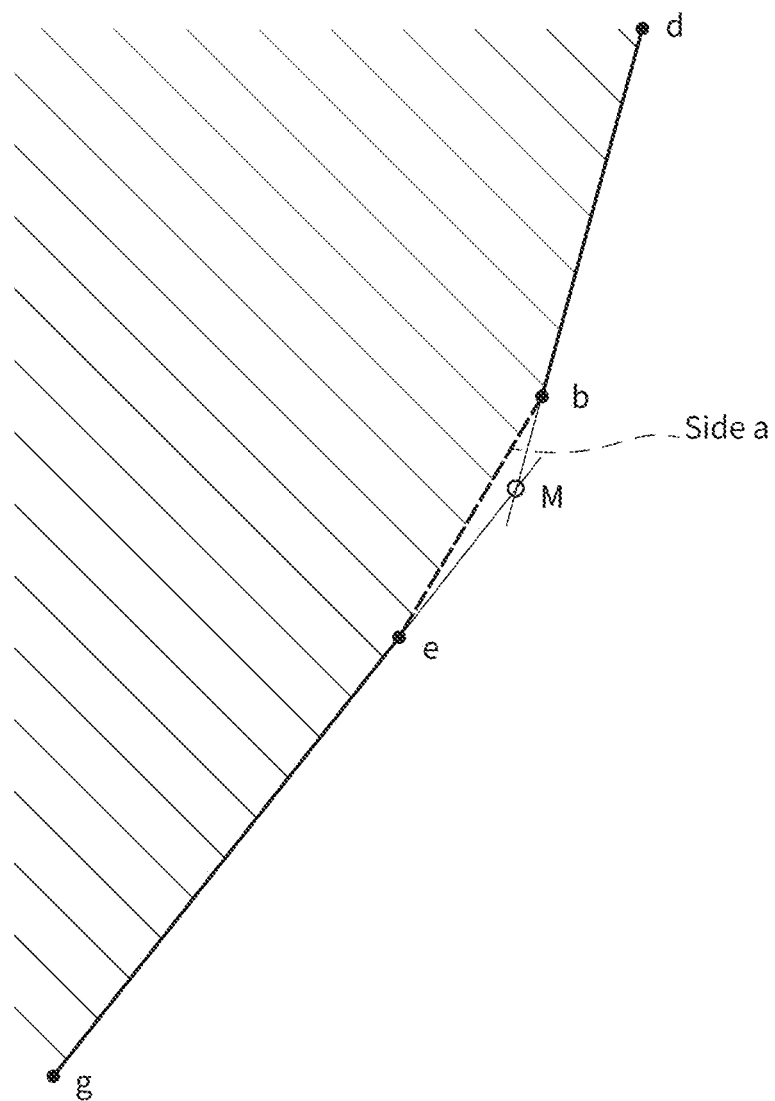
FIG. 15 is a second diagram showing an example of the simplification processing of the mask information adjusting apparatus in this embodiment.

FIG. 15 is a second diagram showing an example of the simplification processing of the mask information adjusting apparatus 1.

FIG. 15 shows an enlarged view of the portion around the side a in FIG. 14. In the case of removing the side a, the intersection M of the half-lines eg and bd is a new vertex. As a result, the side a and vertices b and e on both sides of the side disappear.

Figure 16:
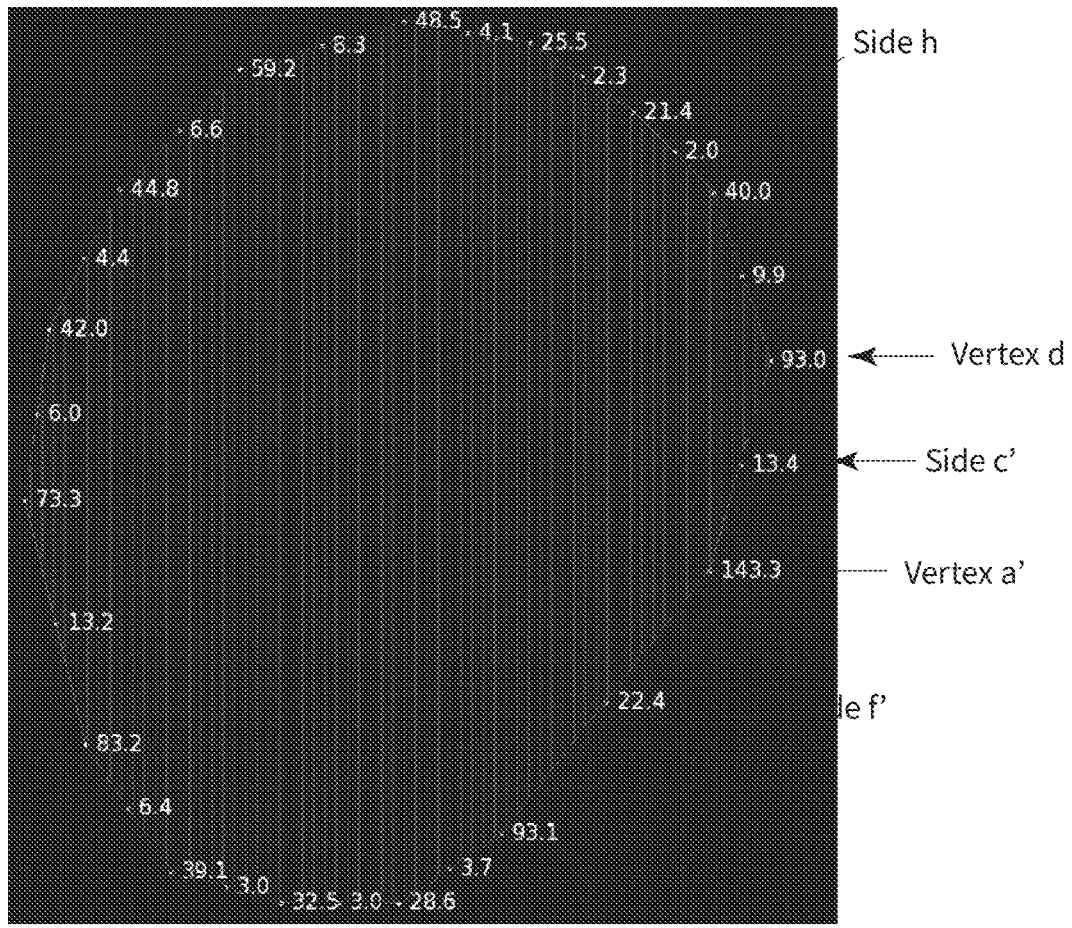
FIG. 16 is a third diagram showing an example of the simplification processing of the mask information adjusting apparatus in this embodiment.

FIG. 16 is a third diagram showing an example of the simplification processing of the mask information adjusting apparatus 1.

As shown in FIG. 16, when the original side a is removed together with the vertices b and e in this manner, the intersection of the half-lines eg and bd is a new vertex a'. The segment a'd that connects the vertices a' and d is referred to as a side c', and the segment a'g that connects the vertices a' and g is referred to as a side f'. When the shape of the mask pattern after the removal changes in this manner, the degrees of influence of the sides c and f before the removal and the vertices d and g located adjacent thereto change. FIG. 16 shows a state in which the changed degrees of influence are acquired again.

In this mask pattern after the removal, a side or vertex with the lowest degree of influence is a side h (degree of influence=2.0). In this case, the side h is removed, and the degrees of influence of the portion therearound after the removal are acquired again. In this manner, in this embodiment, removal of a side or vertex and re-acquisition of the degrees of influence of the portion therearound are repeated in the order in order from the one with the lowest degree of influence. Then, if the degrees of influence of all sides and vertices of the mask pattern reach or exceed a certain value, the simplification processing ends.

Figure 17:
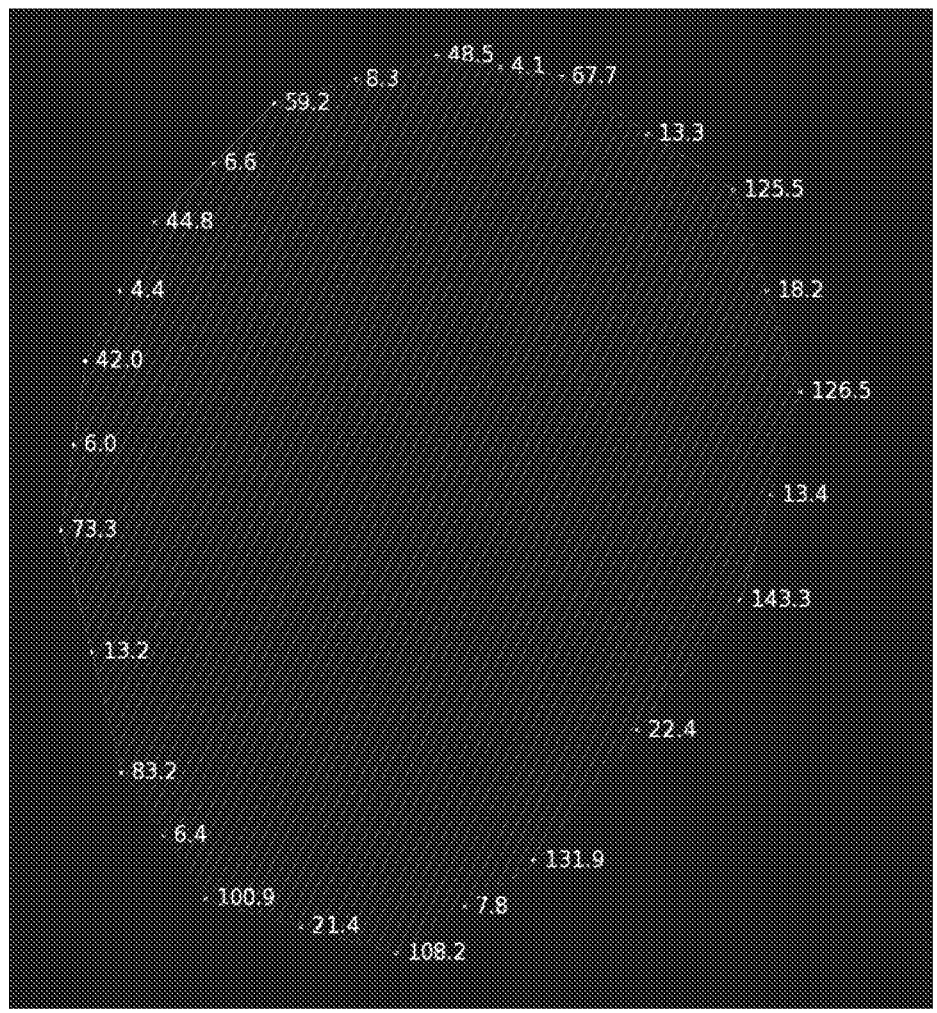
FIG. 17 is a fourth diagram showing an example of the simplification processing of the mask information adjusting apparatus in this embodiment.

FIG. 17 is a fourth diagram showing an example of the simplification processing of the mask information adjusting apparatus 1.

FIG. 17 shows a state in which the degrees of influence of all sides and vertices of the mask pattern are 4 or more. If the end condition is set that the degrees of influence of all sides and vertices of a mask pattern are 4 or more, the simplification processing ends in this state, and the procedure advances to the mask data preparation step by the mask information converting apparatus 300.

As described above, in this embodiment, with respect to mask information containing complex a polygonal mask pattern such as a polygonal mask pattern obtained by approximating smooth curves, it is possible to obtain a precise exposure pattern, and to reduce the data size of the mask information in a way that has a small computational load.

Below are the simulation results for the production of photomasks that are produced respectively using a mask pattern subjected to the simplification processing according to this embodiment and a mask pattern according to a conventional example. In the following conventional example, the result of vertex count reduction processing by specific existing OPC software is used. In the vertex count reduction processing of this conventional example, vertex decimation is performed for each predetermined area.

Figure 18:
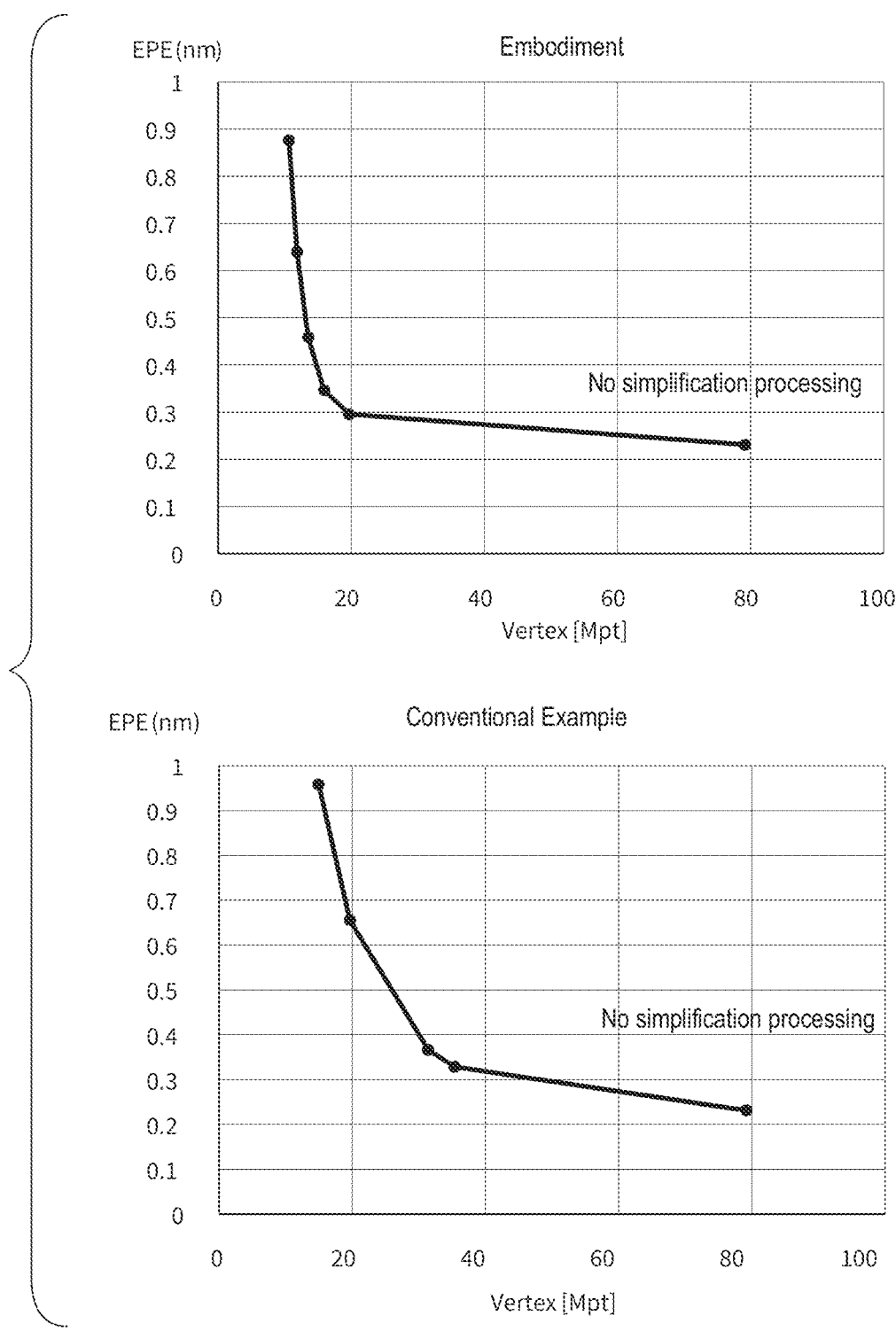
FIG. 18 is a graph regarding results of the simplification processing of the mask information adjusting apparatus in this embodiment.

FIG. 18 is a graph regarding results of the simplification processing of the mask information adjusting apparatus 1.

In the graph shown in FIG. 18, the vertical axis indicates EPE, and the horizontal axis indicates the number of vertices after simplification processing. The upper graph is regarding the simplification processing according to this embodiment, and the lower graph is regarding the conventional example. The rightmost plot in each graph (about 80 Mpt) indicates the case in which no simplification processing or vertex count reduction processing is performed. Each graph shows the results of obtaining the average EPE (Edge Placement Error) of the entire mask from a comparison between the pre-adjustment mask pattern and the post-adjustment mask pattern. It can be seen from a comparison between these graphs that the EPE values are smaller across the entire range of the number of vertices when the simplification processing according to this embodiment is performed.

The configurations of the mask information adjusting apparatus 1, the photomask producing system 900, and the other apparatuses are not limited to those described in the foregoing embodiment. That is to say, the configuration of the mask information adjusting apparatus 1 may be contained in another apparatus, or the configuration of another apparatus may be contained in the mask information adjusting apparatus 1. For example, the mask information adjusting apparatus 1 may further include the preparing unit 341 that performs mask data preparation based on the post-adjustment mask information output by the output unit 160, and the mask information adjusting apparatus 1 may also be able to perform MPC/MDP processing and the like. In this case, it is possible to interpret the above-described mask information converting apparatus 300 as including the configuration of the mask information adjusting apparatus 1. For example, the mask information adjusting apparatus 1 may further include the mask pattern generating unit 243, the mask pattern converting unit 245, and the like for performing OPC or generating a polygonal mask pattern before simplification, and the mask information adjusting apparatus 1 may be configured to produce precise exposure patterns and generate mask information with a small data size. In this case, it is possible to interpret the above-described mask information designing apparatus 200 as including the configuration of the mask information adjusting apparatus 1.

For example, if the mask information adjusting apparatus 1 is used to perform post-processing of OPC, the following advantages are achieved. That is to say, it is assumed that a smooth curve is obtained inside the program by implementing ILT processing. If ordinary polygonal approximation is performed here with sufficient precision, and then the simplification processing according to this embodiment is applied, a mask pattern as desired in ILT can be output with a small amount of data without impairing the performance of the final mask. With a small amount of data, it is possible to transfer various types of data in a short time. The load on the mask data preparation system including MPC thereafter will be reduced, and the data transfer to the mask writing apparatus 501 thereafter can also be performed in a short time. The throughput of data processing can be improved throughout the entire photomask producing system 900.

Furthermore, for example, a pipeline method may be adopted to perform MPC/MDP continuously at the facility after performing OPC as a data processing step. For example, in the case in which the mask information adjusting apparatus 1 is used in an intermediate step in the OPC-MPC/MDP pipeline processing in this manner as well, as described above, the MPC/MDP processing and the transfer to the mask writing apparatus 501 can be performed in a short time.

Furthermore, for example, if the OPC outputs a group of polygons with a sufficient degree of approximation, the simplification processing according to this embodiment may be performed prior to the following MPC/MDP processing. In the case in which the mask information adjusting apparatus 1 is used in a pre-processing step for MPC/MDP in this manner as well, as described above, the time required for the MPC/MDP processing can be reduced compared to the case where no simplification is performed. Also, data after the MDP processing can be transferred to a writing apparatus in a short time. In this case, the input to MPC/MDP processing does not have to be the output of OPC. The simplification processing according to this embodiment can be expected to be effective for any pattern that attempts to express a smooth curve. For example, the simplification processing according to this embodiment can be used for patterns of photonic devices.

The processing in this embodiment may be realized by software. The software may be distributed by software downloads or the like. Furthermore, the software may be distributed in a form where the software is stored in a recording medium such as a CD-ROM. The software that realizes the mask information adjusting apparatus 1 in this embodiment is the following sort of program. Specifically, this program is a program for causing a computer for adjusting mask information for use in production of a photomask, to function as: a subject information acquiring unit that acquires pre-adjustment mask information containing a polygonal mask pattern; a processing unit that acquires the degree of influence of removal of each vertex or side of the mask pattern, on an exposure pattern that is generated using a photomask corresponding to the mask pattern, in association with the vertex or point, and simplifies the mask pattern by removing each vertex or side according to whether or not a predetermined condition is satisfied by the acquired degree of influence; and an output unit that outputs post-adjustment mask information containing the mask pattern that has been simplified by the processing unit.

Others

Figure 19:
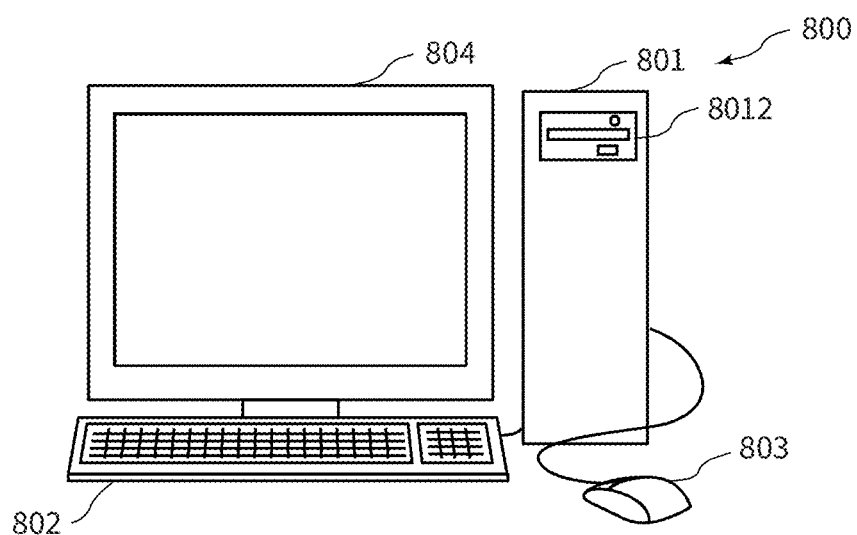
FIG. 19 is a conceptual diagram of a computer system in the foregoing embodiment.
Figure 20:
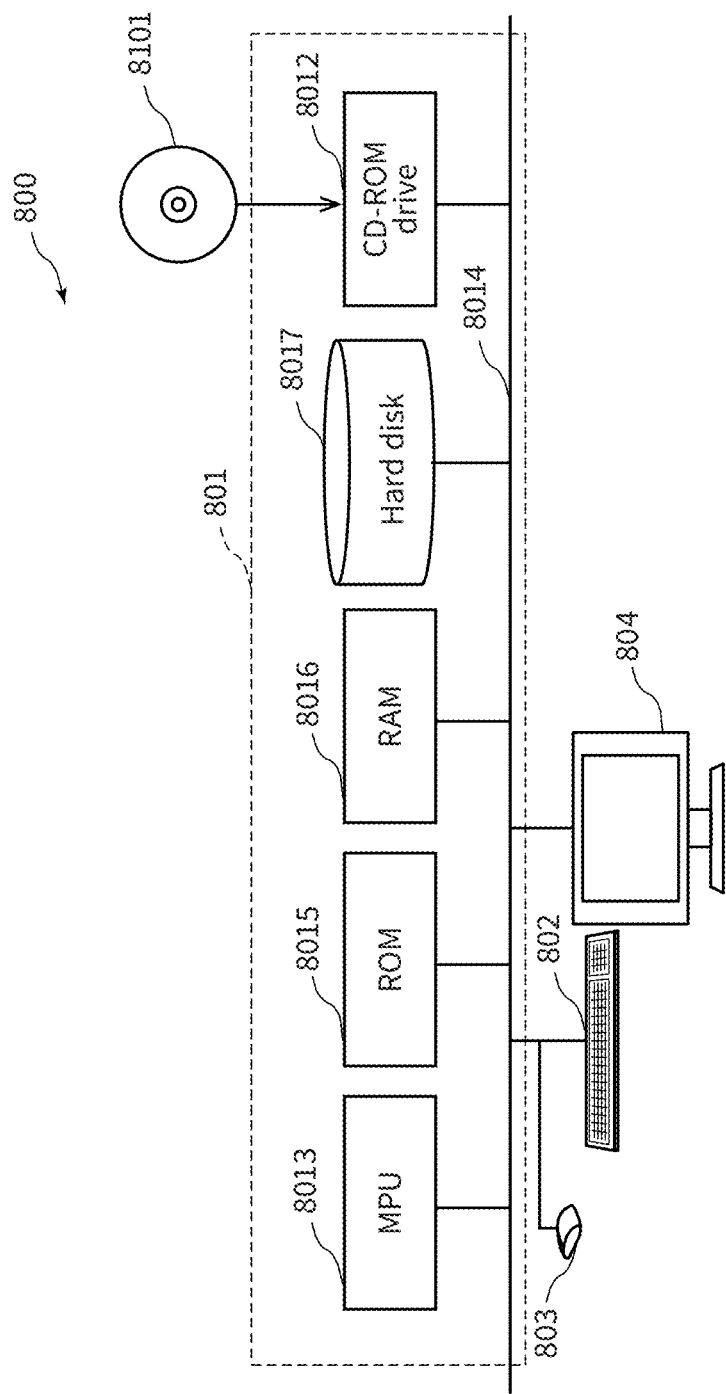
FIG. 20 is a block diagram of the computer system in this embodiment.

FIG. 19 is a schematic view of a computer system 800 in the foregoing embodiment. FIG. 20 is a block diagram of the computer system 800 in the foregoing embodiment.

These drawings show the configuration of a computer that executes the program described in this specification to realize the mask information adjusting apparatus 1 and the like in the foregoing embodiment. The foregoing embodiment may be realized using computer hardware and a computer program executed thereon.

The computer system 800 includes a computer 801 including a CD-ROM drive, a keyboard 802, a mouse 803, and a monitor 804.

The computer 801 includes, in addition to the CD-ROM drive 8012, an MPU 8013, a bus 8014 connected to the CD-ROM drive 8012 and the like, a ROM 8015 in which a program such as a boot up program is stored, a RAM 8016 that is connected to the MPU 8013 and is a memory in which a command of an application program is temporarily stored and a temporary storage area is provided, and a hard disk 8017 in which an application program, a system program, and data are stored. Although not shown, the computer 801 may further include a network card that provides connection to a LAN.

The program for causing the computer system 800 to execute the functions of the information processing apparatus and the like in the foregoing embodiment may be stored in a CD-ROM 8101 that is inserted into the CD-ROM drive 8012, and be transmitted to the hard disk 8017. Alternatively, the program may be transmitted via a network (not shown) to the computer 801 and stored in the hard disk 8017. At the time of execution, the program is loaded into the RAM 8016. The program may be loaded from the CD-ROM 8101, or directly from a network.

The program does not necessarily have to include, for example, an operating system (OS) or a third party program to cause the computer 801 to execute the functions of the information processing apparatus and the like in the foregoing embodiment. The program may only include a command portion to call an appropriate function (module) in a controlled mode and obtain desired results. The manner in which the computer system 800 operates is well known, and thus a detailed description thereof has been omitted.

It should be noted that, in the program, in a transmitting step of transmitting information, a receiving step of receiving information, or the like, processing that is performed by hardware, for example, processing performed by a modem or an interface card in the transmitting step (processing that can be performed only by hardware) is not included.

Furthermore, the computer that executes this program may be a single computer, or may be multiple computers. That is to say, centralized processing may be performed, or distributed processing may be performed.

Furthermore, in the foregoing embodiment, it will be appreciated that two or more constituent elements in one apparatus may be physically realized by one medium.

In the foregoing embodiment, each process (each function) may be realized as centralized processing using a single apparatus (system), or may be realized as distributed processing using multiple apparatuses (in this case, the entire system constituted by multiple apparatuses that perform distributed processing may be regarded as one "apparatus").

Furthermore, in the foregoing embodiment, information transmission performed between constituent elements may be such that, for example, if two constituent elements for transmitting information are physically different from each other, the transmission is performed by one of the constituent elements outputting the information and the other constituent element accepting the information, or alternatively, if two constituent elements for transmitting information are physically the same, the transmission is performed by shifting from a processing phase corresponding to one of the constituent elements to a processing phase corresponding to the other constituent element.

Furthermore, in the foregoing embodiment, information related to the processing that is performed by each constituent element, for example, information that is to be accepted, acquired, selected, generated, transmitted, or received by each constituent element, information such as a threshold value, a numerical expression, or an address used by each constituent element in the processing and the like may be retained in an unshown recording medium temporarily or for a long period of time even if not specified in the description above. Furthermore, the information may be accumulated in the unshown recording medium by each constituent element or by an unshown accumulating unit. Furthermore, the information may be read from the unshown recording medium by each constituent element or by an unshown reading unit.

Furthermore, in the foregoing embodiment, if information used in each constituent element or the like, for example, information such as a threshold value, an address, or various setting values used in each constituent element in the processing may be changed by a user, the user may be or may not be allowed to change such information as appropriate even if not specified in the description above. If the user is allowed to change such information, the change may be realized by, for example, an unshown accepting unit that accepts a change instruction from the user and an unshown changing unit that changes information according to the change instruction. The unshown accepting unit may accept the change instruction, for example, by accepting information from an input device, by receiving information transmitted via a communication line, or by accepting information read from a predetermined recording medium.

The present invention is not limited to the embodiment set forth herein. Various modifications are possible within the scope of the invention.

The configuration of the foregoing embodiment is not limited to that described above, and some of the constituent elements or the functions may be omitted in the foregoing embodiment.

INDUSTRIAL APPLICABILITY

As described above, the mask information adjusting apparatus according to the present invention has an effect that it is possible to reduce the data size of mask information while preventing a significant influence on an exposure pattern, and thus this apparatus is useful as a mask information adjusting apparatus and the like.

LIST OF REFERENCE NUMERALS

1 Mask information adjusting apparatus
110 Storage unit
120 Receiving unit
130 Accepting unit
140 Processing unit
141 Subject information acquiring unit
143 Influence degree acquiring unit
145 Removing unit
160 Output unit
170 Transmitting unit
200 Mask information designing apparatus
210 Second storage unit
240 Second processing unit
241 Target exposure pattern acquiring unit
243 Mask pattern generating unit
245 Mask pattern converting unit
270 Second transmitting unit
300 Mask information converting apparatus
310 Third storage unit
320 Third receiving unit
340 Third processing unit
341 Preparing unit
370 Third transmitting unit
501 Mask writing apparatus
900 Photomask producing system

The invention claimed is:

1. A mask information adjusting apparatus for adjusting mask information for use in production of a photomask, comprising:
   a subject information acquiring unit that acquires pre-adjustment mask information containing a polygonal mask pattern;
   a processing unit that acquires the degree of influence of removal of each vertex or side of the mask pattern, on an exposure pattern that is generated using a photomask corresponding to the mask pattern, in association with the vertex or point, and simplifies the mask pattern by removing each vertex or side according to whether or not a predetermined condition regarding the acquired degree of influence is satisfied; and
   an output unit that outputs post-adjustment mask information containing the mask pattern that has been simplified by the processing unit.

2. The mask information adjusting apparatus according to claim 1, wherein the processing unit acquires the degrees of influence of all vertices or all sides of the mask pattern, and removes a vertex or point with the lowest degree of influence acquired.

3. The mask information adjusting apparatus according to claim 1, wherein the processing unit removes one vertex or side of the mask pattern, acquires the degree of influence of removal of each vertex or side of the mask pattern from which the one vertex or side has been removed, and further removes one vertex or side of the mask pattern based on the acquired degree of influence in a case in which a predetermined end condition is not satisfied or ends the simplification of the mask pattern in a case in which the predetermined end condition is satisfied.

4. The mask information adjusting apparatus according to claim 3, wherein the processing unit acquires the degree of influence of the mask pattern from which the one vertex or side has been removed, compares each degree of influence acquired and a predetermined threshold value, and ends the simplification of the mask pattern in a case in which a comparison result satisfies the end condition.

5. The mask information adjusting apparatus according to claim 1, wherein, as the degree of influence of each vertex or side of the mask pattern, the processing unit acquires a value corresponding to the amount of change in an area of the mask pattern caused by removing the vertex or side.

6. The mask information adjusting apparatus according to claim 1, wherein, as the degree of influence of one side constituting the mask pattern, the processing unit acquires an area of a triangle formed by the side and half-lines including adjacent sides that are each adjacent to the side and having start points at vertices that are different from vertices that are each shared with the side.

7. The mask information adjusting apparatus according to claim 1, wherein, in a case of removing one side constituting the mask pattern, the processing unit sets, as a vertex in a mask pattern after the removal of the side, an intersection of half-lines including adjacent sides that are each adjacent to the side and having start points at vertices that are different from vertices that are each shared with the side.

8. The mask information adjusting apparatus according to claim 1, wherein, as the degree of influence of one vertex constituting the mask pattern, the processing unit acquires an area of a quadrilateral formed by two sides that share the vertex and two half-lines including adjacent sides that are respectively adjacent to the two sides and having start points at vertices that are different from adjacent vertices that are each adjacent to the vertex, in a case in which the quadrilateral is not a concave quadrilateral.

9. The mask information adjusting apparatus according to claim 1, wherein, in a case of removing one vertex constituting the mask pattern, in a case in which a quadrilateral formed by two sides that share the vertex and two half-lines including adjacent sides that are respectively adjacent to the two sides and having start points at vertices that are different from adjacent vertices that are each adjacent to the vertex is not a concave quadrilateral, the processing unit sets an intersection of the half-lines as a vertex in a mask pattern after the removal.

10. The mask information adjusting apparatus according to claim 1, wherein, as the degree of influence of one vertex constituting the mask pattern, the processing unit acquires an area of a triangle formed by two sides that share the vertex and a segment that connects two adjacent vertices that are each adjacent to the vertex, in a case in which a quadrilateral formed by the two sides that share the vertex and two half-lines including adjacent sides that are respectively adjacent to the two sides and having start points at vertices that are different from the adjacent vertices is a concave quadrilateral.

11. The mask information adjusting apparatus according to claim 1,
   wherein, in a case of removing one vertex constituting the mask pattern, in a case in which a quadrilateral formed by two sides that share the vertex and two half-lines including adjacent sides that are respectively adjacent to the two sides and having start points at vertices that are different from adjacent vertices that are each adjacent to the vertex is a concave quadrilateral, the processing unit sets a first point that is located on one of the two half-lines and a second point that is located on the other half-line, as vertices in a mask pattern after the removal, and
   the first point and the second point are positioned such that an area of a quadrilateral formed by a segment that connects the first point and the second point, a segment that connects the adjacent vertices, and the two half-lines is equal to an area of a triangle formed by the two sides that share the vertex and a segment that connects the adjacent vertices.

12. The mask information adjusting apparatus according to claim 1, wherein the preadjustment mask information contains a mask pattern generated through OPC (optical proximity effect correction).

13. The mask information adjusting apparatus according to claim 1, wherein the subject information acquiring unit acquires a target mask pattern corresponding to a target exposure pattern, and acquires the preadjustment mask information based on the acquired target mask pattern.

14. The mask information adjusting apparatus according to claim 1, further comprising a preparing unit that performs mask data preparation based on the postadjustment mask information output by the output unit.

15. A mask data adjusting method for adjusting mask information for use in production of a photomask, comprising:
 a subject information acquiring step of acquiring preadjustment mask information containing a polygonal mask pattern;
 a processing step of acquiring the degree of influence of removal of each vertex or side of the mask pattern, on an exposure pattern that is generated using a photomask corresponding to the mask pattern, in association with the vertex or point, and simplifying the mask pattern by removing each vertex or side according to whether or not a predetermined condition regarding the acquired degree of influence is satisfied; and
 an output step of outputting post-adjustment mask information containing the mask pattern that has been simplified in the processing step.

16. A non-transitory computer readable medium storing a program for causing a computer for adjusting mask information for use in production of a photomask, to function as:
 a subject information acquiring unit that acquires preadjustment mask information containing a polygonal mask pattern;
 a processing unit that acquires the degree of influence of removal of each vertex or side of the mask pattern, on an exposure pattern that is generated using a photomask corresponding to the mask pattern, in association with the vertex or point, and simplifies the mask pattern by removing each vertex or side according to whether or not a predetermined condition regarding the acquired degree of influence is satisfied; and
 an output unit that outputs post-adjustment mask information containing the mask pattern that has been simplified by the processing unit.

* * * * *